(12) United States Patent
Fujikawa et al.

(10) Patent No.: US 6,491,518 B1
(45) Date of Patent: Dec. 10, 2002

(54) APPARATUS FOR HIGH-TEMPERATURE AND HIGH-PRESSURE TREATMENT

(75) Inventors: Takao Fujikawa, Takasago (JP); Takahiko Ishii, Osaka (JP); Yutaka Narukawa, Takasago (JP); Makoto Kadoguchi, Takasago (JP)

(73) Assignee: Kabushiki Kaisha Kobe Seiko Sho, Kobe (JP)

( * ) Notice: Subject to any disclaimer, the term of this patent is extended or adjusted under 35 U.S.C. 154(b) by 0 days.

(21) Appl. No.: 09/287,558

(22) Filed: Apr. 6, 1999

(30) Foreign Application Priority Data

| Apr. 9, 1998 | (JP) | 10-097735 |
| Apr. 24, 1998 | (JP) | 10-114988 |
| May 21, 1998 | (JP) | 10-139841 |

(51) Int. Cl.⁷ ................................................ F27D 3/12
(52) U.S. Cl. .................. 432/241; 432/253; 118/728
(58) Field of Search .................. 432/241, 253; 118/728; 211/41.18; 219/390, 405, 411; 392/416, 418

(56) References Cited

U.S. PATENT DOCUMENTS

| 4,471,949 A | * | 9/1984 | Ishii ........................... 266/252 |
| 4,522,660 A | * | 6/1985 | Suzuki et al. ................ 148/222 |
| 5,137,755 A | * | 8/1992 | Fujikawa et al. ........... 427/228 |
| 5,167,716 A | | 12/1992 | Boitnott et al. |
| 5,307,568 A | * | 5/1994 | Matsuo et al. ................ 34/92 |
| 5,458,688 A | * | 10/1995 | Watanabe ................... 118/724 |
| 5,518,771 A | | 5/1996 | Jeffryes et al. |
| 5,527,561 A | | 6/1996 | Dobson |
| 5,556,275 A | * | 9/1996 | Sakata et al. ............... 432/241 |
| 5,711,811 A | | 1/1998 | Suntola et al. |
| 5,897,311 A | * | 4/1999 | Nishi ......................... 432/239 |
| 5,932,289 A | | 8/1999 | Dobson et al. |

FOREIGN PATENT DOCUMENTS

| JP | 62-140413 | * | 6/1987 |
| JP | 63-41787 | | 2/1988 |
| JP | 63-267883 A | * | 11/1988 |
| JP | 1-181089 A | * | 7/1989 |
| JP | 3-252081 A | * | 11/1991 |
| JP | 6-248456 A | * | 9/1994 |

OTHER PUBLICATIONS

Korean Intellectual Property Office, Notice of Grounds for Refusal, issued Dec. 20, 2000 in Korean Patent Application No. 1999–12472.

* cited by examiner

*Primary Examiner*—Jiping Lu
(74) *Attorney, Agent, or Firm*—Oblon, Spivak, McClelland, Maier & Neustadt, P.C.

(57) ABSTRACT

An apparatus treating substrates in a high-temperature and high-pressure atmosphere, the substrates being treated in a batch that includes one lot of the substrates treated as a unit. A supporting jig is provided with means to support a plurality of the substrates in a shelved arrangement, the supporting jig and substrates being configured to enter and exit from a treating chamber within a pressure vessel as a single unit. The supporting jig is surrounded by a casing. In order to cope with the difficulty of oxidization of the substrates, an oxygen getter is disposed in either the supporting jig or in the casing. The pressure vessel includes an opening whereby a reducing gas can be introduced into the treating chamber. Further, the pressure vessel and a stocking portion of the substrates are installed within a housing such that contamination is further reduced and control is made easier.

18 Claims, 17 Drawing Sheets

APPARATUS FOR HIGH-TEMPERATURE AND HIGH-PRESSURE TREATMENT

BACKGROUND OF THE INVENTION

A. Field of the Invention

The present invention relates to an apparatus for treating ULSI (ultra large scale integration) semiconductors such as a Si wafer in specific atmospheric conditions, such as high-temperature and high-pressure conditions. It, more particularly, relates to an apparatus for treating semiconductor substrates typically in units of one lot made up of 13 or 25 sheets of substrates. Still more particularly, the invention relates to a high-temperature and high-pressure gas furnace for use in treatment of semiconductors to remove voids existing thereon chiefly by the use of inert gas pressure, and a method for treating a wafer on which a wiring film of aluminum alloy or copper alloy has been formed by a PVD method (physical vapor deposition), by applying pressure of an inert gas thereto, the so-called pressure fill process of wiring film (high-pressure reflow process).

B. Description of the Related Art

Fabricating processes of semiconductor wafers are known. Such processes include pressure treatment with the use of gas pressure, methods to treat a wafer under pressure in an inert gas, where the wafer includes a wiring film of aluminum alloy or copper alloy is formed through the PVD method, the so-called pressurized fill process of the wiring film (high-pressure reflow process).

Further, as a process for treating semiconductors is known which includes the use of high-pressure gas up to the level of several tens of atmospheric pressure, and a high-pressure oxidizing method causing the surface of the Si wafer to oxidize forming an insulating layer is known. In this case, because the objective of the process is oxidization, oxygen or water is naturally mixed in the pressurized medium.

In the known method, an apparatus is known performs high-pressure treatment of the semiconductor one by one as each wafer has gone through the PVD process, i.e., that of the so-called single wafer cluster tool type. As disclosed in the gazette of Japanese Patent Laid-open No. Hei 7-193063, for example, the apparatus is configured to process a wafer moved into a lock chamber by moving it through a series of processing modules disposed around a core chamber one after another by means of a transport arm within the core chamber. One of the modules is a pressure treating module directly mounted on the core chamber. An example of such a detailed structure of a pressure module is proposed in the gazette of Japanese Patent Publication No. Hei 7-502376.

An apparatus for use in the latter method is disclosed in the gazette of Japanese Patent Laid-open No. Hei 4-234119 is known. Although this apparatus is for a completely different use from the use of the present invention, it is mentioned here just for reference as an example of known apparatuses because both are of similar structure.

Namely, this apparatus is an apparatus for treating semiconductor wafer comprising: a pressure vessel; a hollow member with a treating chamber incorporated therein disposed within the pressure vessel, said hollow member having an opening at the lower portion thereof for receiving the wafers when said pressure vessel and said hollow member move a plurality of wafers as a unit each time of treatment from a position at the lower portion of said pressure vessel into said treating chamber; movement means capable of moving vertically with respect to said pressure vessel for shutting said opening; means coupled with said hollow member for introducing a pressurized oxidizing agent into said treating chamber; means for introducing a pressurized inert gas into said pressure vessel; means for heating the oxidizing agent within said treating chamber; means for cooling said hollow member after the wafers have gone through treatment within said treating chamber; and means coupled with said pressure vessel and said hollow member for equalizing pressures of the inert gas and the oxidizing agent and coupled with the body of the apparatus for equalizing the pressures of the inert gas and the oxidizing agent, thereby essentially separating said inert gas from said oxidizing agent.

As an apparatus for treatment under high-temperature and high-pressure conditions by using a pressurized gas, a hot isotropic pressure apparatus (HIP apparatus) is known and there is one, as an example, that is disclosed in the gazette of Japanese Patent Laid-open No. Sho 63-41787.

The apparatus of the single wafer type mentioned first above (the first prior art example) is different in the manner of treatment from the present invention. Therefore, it has a greater problem resulting from the treatment itself rather than that of a defect in the structure of the apparatus. Namely, in the first prior art example, each wafer is processed on a one-by-one basis and because of the cycle of time required, the process cannot be performed at the same rate a PVD process, which is performed in parallel. Therefore, the first processing of each wafer slows down the overall process. Therefore, components including the sealing structure and material at the opening and shutting portion of the vessel are subjected to very severe conditions and therefore it is quite difficult to secure the safety and reliability on the treatment.

The high pressure oxidization apparatus mentioned second above (the second prior art example) performs operation with inert gas introduced therein when no oxidizing agent is introduced. Here, since the apparatus of this kind is originally designed for an oxidization process, air unavoidably entering the high pressure vessel when articles to be treated are taken into and out of the vessel has not been considered, i.e., no consideration has been given to mixing in of oxygen accompanying the mixing in of air. Therefore, when it is intended to operate the apparatus as a high-temperature and high-pressure gas furnace that will process semiconductors, as the articles of fabrication in the present invention, in the conditions close to a completely inert environment, especially in the environment free from oxygen, it appears to provide unsatisfactory results.

Lately, copper has come more attractive than Al as the material of the wiring film in view of its low electric resistivity and its characteristics against EM (Electron Migration) and it is desirable to also apply the pressurized fill process to the wafer after the film has been formed thereon in the fabrication of ULSI which are getting more and more micro-miniaturized. In this case, when the wafer after the film has been formed thereon is handled in the atmospheric air, it is feared that the copper film is oxidized and the pressurized fill process is thereby disturbed. In any of the related arts mentioned above, no consideration has been given to countermeasures against such oxidization.

SUMMARY OF THE INVENTION

The invention is aimed at the provision of high-temperature and high-pressure gas furnace in which the above enumerated problems are solved. More concretely, it is an object of the invention to provide a high-temperature and high-pressure gas furnace capable of performing, on a batch system, the pressurized fill process of the wiring film on a plurality (great number) of semiconductor substrates, typically Si wafers, set in the so-called shelved arrangement.

In order to solve the above enumerated problems, this invention provides an apparatus for high-temperature and high-pressure treatment for treating substrates to be treated in an atmosphere of a high-temperature and high-pressure gas which comprises: a pressure vessel; a treating chamber within the pressure vessel; a gas passage for introducing a high pressure gas into the pressure vessel; a heater provided within the treating chamber; a supporting jig for setting the substrates to be treated in a shelved arrangement, the supporting jig allowing a plurality of the substrates to be treated to be inserted into the treating chamber; and a bell-shaped casing surrounding the supporting jig inserted into the treating chamber.

By adopting such a configuration, it is possible to process a plurality of the substrates as a lot and treat the lot of the substrates as a unit under high-temperature and high-pressure conditions.

According to the conventional single wafer type method, substrates were treated one by one. Therefore, contamination such as oxygen and water was generated with each treatment and also dust is produced with each treatment and, thereby, cleanness of the gas used for treatment deteriorated. Since batch treatment can be practiced in the present invention, the above mentioned problems with the related art can be solved. Further, in wiring film processing, the method of the invention can be smoothly combined with existing PVD systems.

Further, in the present invention, the supporting jig is shaped in a cylindrical form, provided with an air hole in its cylindric body portion, and provided with an oxygen getter member or members disposed at top and/or bottom portions thereof.

By adopting such a configuration, oxidization of the substrate to be treated by oxygen as impurity in the treatment gas such as argon and nitrogen can be prevented. Further, heat transfer and gas convection during the treatment can be promoted.

Further, in the present invention, the bell-shaped casing is made up of an inner casing and an outer casing, with a, gas passage formed therebetween, and a gas hole is made in the inner casing at its top portion and an oxygen getter member is disposed in the vicinity of the gas hole or on the gas passage.

By adopting such a configuration, oxygen mixed in the gas passage can be removed and the gas entering the interior of the casing during the pressure treatment can be prevented and, hence, it also becomes possible to recover and reuse the gas used for treatment.

Further, in the present invention, the supporting jig is inserted into the treating chamber by means of a treating stand disposed at the lower portion of the treating chamber and the treating stand is provided with a heat insulating material disposed therein.

By adopting such a configuration, inserting into and removing the substrates from the treating chamber can be made on a batch system so that the treating efficiency can be improved and heat transfer to the bottom lid can be suppressed by the heat insulating material within the treating stand so that the temperature of the bottom lid can be prevented from rising to an extreme level.

As the oxygen getter material, titanium is preferred when the gas for high pressure treatment is nitrogen, and titanium or zirconium is preferred when the gas for high pressure treatment is argon. The oxygen getter member is preferably placed at a position where gas flows well by gas convection. Since the oxygen getter member absorbs the larger amount of oxygen the higher the temperature is, it is preferred to place it in a high temperature position.

Further, in the present invention, by allowing the treating stand with the supporting jig mounted thereon to be inserted into the treating chamber by raising and lowering a bottom lid of the pressure vessel, batch treatment of one lot of substrates as a unit is performed effectively.

Further, in the present invention, the pressure chamber is provided with an opening made therein for allowing a plurality of the substrates moved into and out of the treating chamber by means of the supporting jig, the opening is covered by a cover or a housing made of an airtight material, and an inert gas is allowed to flow into the inside of the cover or the housing.

By adopting such a configuration, contamination by oxygen of the substrates to be treated when one lot thereof as a unit are taken out, can be prevented.

The present invention, by further having an evacuating port and a port valve allowing the port to open and shut, the port and the port valve being disposed at the portion of a top lid or the portion of a bottom lid of the pressure vessel, the adsorbed water by the inner surface and the like of the pressure vessel can be removed in a short time.

Further, the invention may be configured to have a pipe system communicatively connected with the treating chamber for supplying a reducing gas and a stop valve disposed on the reducing gas supplying circuit including the pipe system.

By adopting such a configuration, problems, which have so far been difficult to solve, of oxidization of the metallic film occurring when a substrate with the metallic film formed thereon is taken out into the open air and the accompanying deterioration of fluidity and of the necessity of using a higher pressure than usual to remove the voids when copper is used as the wiring material on account of insufficient fluidity because of the high melting point of copper can now be solved.

Here, it is preferred that an inlet be provided in the bell-shaped casing for allowing the gas supplied from the pipe system to flow into the bell-shaped casing. Thereby, contamination from heating elements can be prevented.

Further, the invention may be configured to have a stocking portion for stocking the substrates to be treated, a transport apparatus for taking the substrate to be treated on the stocking portion into and out of the treating chamber, and an airtight housing for housing the stocking portion, the transport apparatus, and the pressure vessel.

By adopting such a configuration, it becomes possible to collectively house the pieces of high pressure equipment in the housing and achieve good safety control.

Further, the invention may be configured such that a bottom lid allowing the opening portion at the bottom end of the pressure vessel to be opened and shut, a furnace pedestal, and the supporting jig supported on the bottom lid, via the furnace pedestal, are integrally adapted to be taken into and out of the pressure vessel from thereunder and the transport means may be made up of a bottom lid lifting and turning apparatus for raising and lowering and turning the bottom lid, and a shifting and mounting apparatus disposed between the bottom lid lifting and turning apparatus and the stocking portion for shifting and mounting the substrates on the stocking portion onto the bottom lid lifting and turning apparatus.

By adopting such a configuration, it becomes possible to allow plural sheets of the substrates to be treated to enter and exit from the treating chamber while they are set in the supporting jig in a shelved arrangement and to realize effective batch treatment.

Further, the airtight housing may be provided with a gas inlet and a gas outlet for allowing a protecting gas to be flowed through the airtight housing.

By adopting such a configuration, it becomes possible to allow an inert gas or nitrogen gas, as a protecting gas, to flow into and out of the housing.

Further, in the airtight housing, a shielding member for partitioning components of the pressure vessel except the bottom lid of the pressure vessel may be provided.

By adopting such a configuration, even if a dust generating source is present above the substrates to be treated, the dust is prevented by the shielding member from falling on the substrates and sticking thereto.

Further, the airtight housing may be provided with a lid member functioning as a safety valve for relieving the internal pressure of the airtight housing.

By adopting such a configuration, safety can be assured even if the treating gas should leak out of the treating chamber of the pressure vessel.

Further, the invention may have a reducing furnace for reducing an oxidized film formed on the surface of the substrate, the reducing furnace being housed in the airtight housing.

Further, the invention is preferably configured such that a bottom lid allowing the opening at the bottom end of the pressure vessel to be opened and shut, a furnace pedestal, and the supporting jig supported on the bottom lid, via the furnace pedestal, are integrally adapted to be taken into and out of the pressure vessel from thereunder, the transport means is made up of a bottom lid lifting and turning apparatus for raising and lowing and turning the bottom lid and a shifting and mounting apparatus disposed between the bottom lid lifting and turning apparatus and the stocking portion for shifting and mounting the substrates to be treated on the stocking portion onto the bottom lid lifting and turning apparatus, and the bottom lid of the reducing furnace and the bottom lid of the pressure vessel are provided by a common lid and the bottom lid, the furnace pedestal, and the supporting jig disposed on the bottom lid, via the furnace pedestal, are integrally adapted to be taken into and out of the reducing furnace from thereunder.

By adopting such configurations, the problem of oxidization of the substrates to be treated can be solved and the pressure treatment and the reducing process can be effectively performed.

DESCRIPTION OF THE PREFERRED EMBODIMENTS

An embodiment of the invention will be described below with reference to the accompanying drawings.

Figure 1:
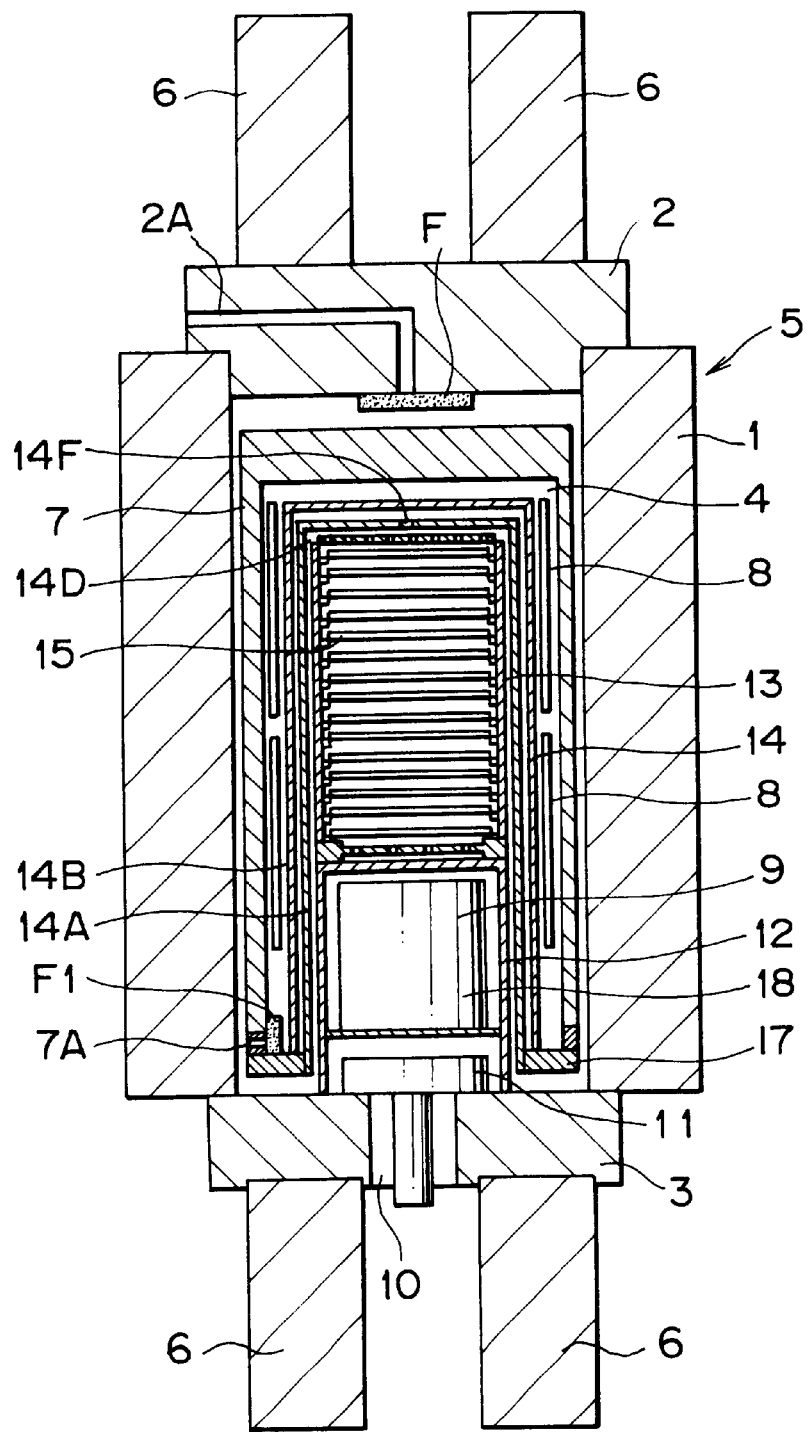
FIG. 1 is a sectional side view of a high-temperature and high-pressure treatment apparatus shown configured for treating a plurality of substrates supported on a supporting jig disposed therein in accordance with a first embodiment of the present invention.
Figure 2:
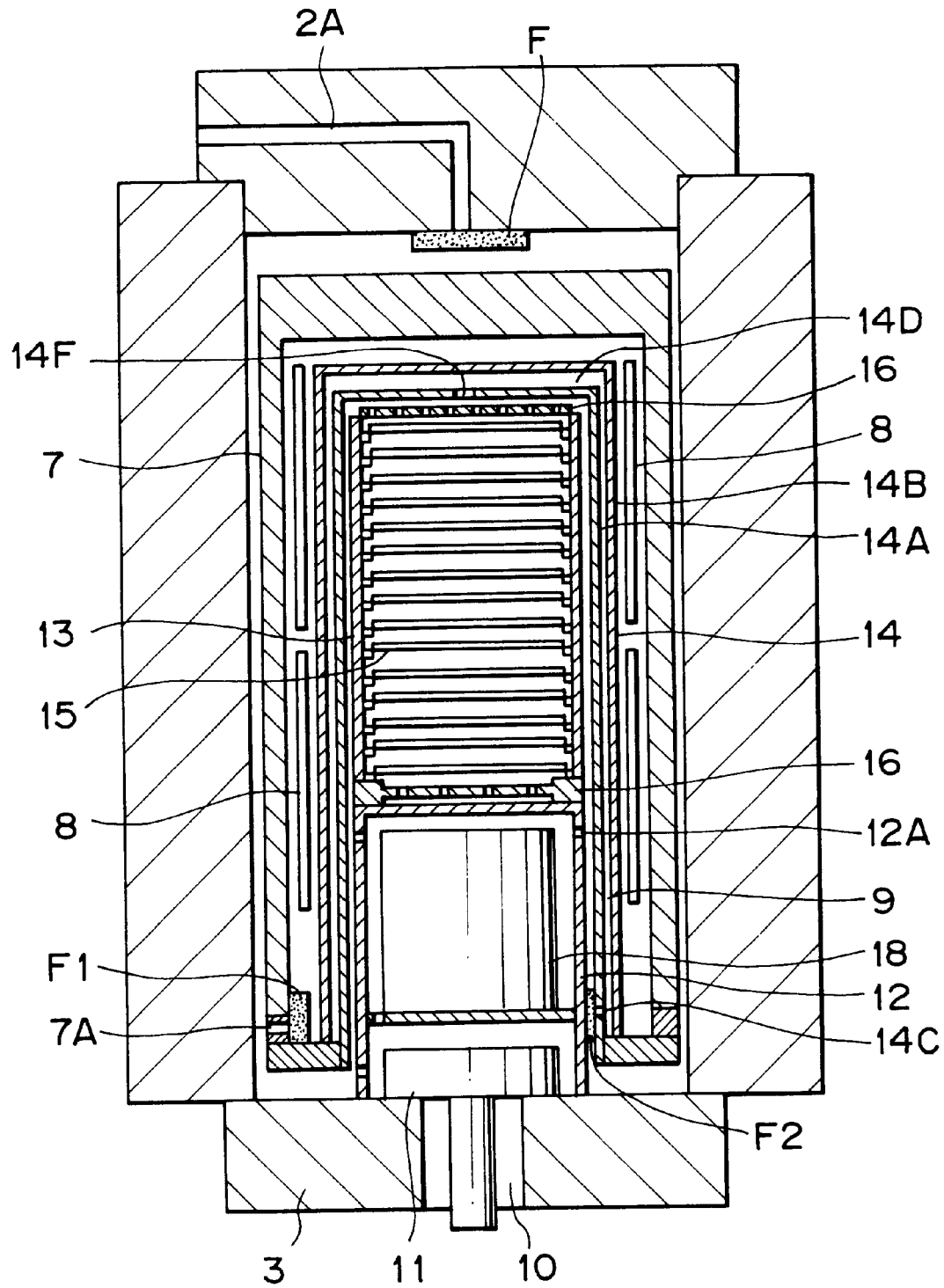
FIG. 2 is an enlarged view of a portion of the treatment apparatus depicted in FIG. 1.
Figure 3:
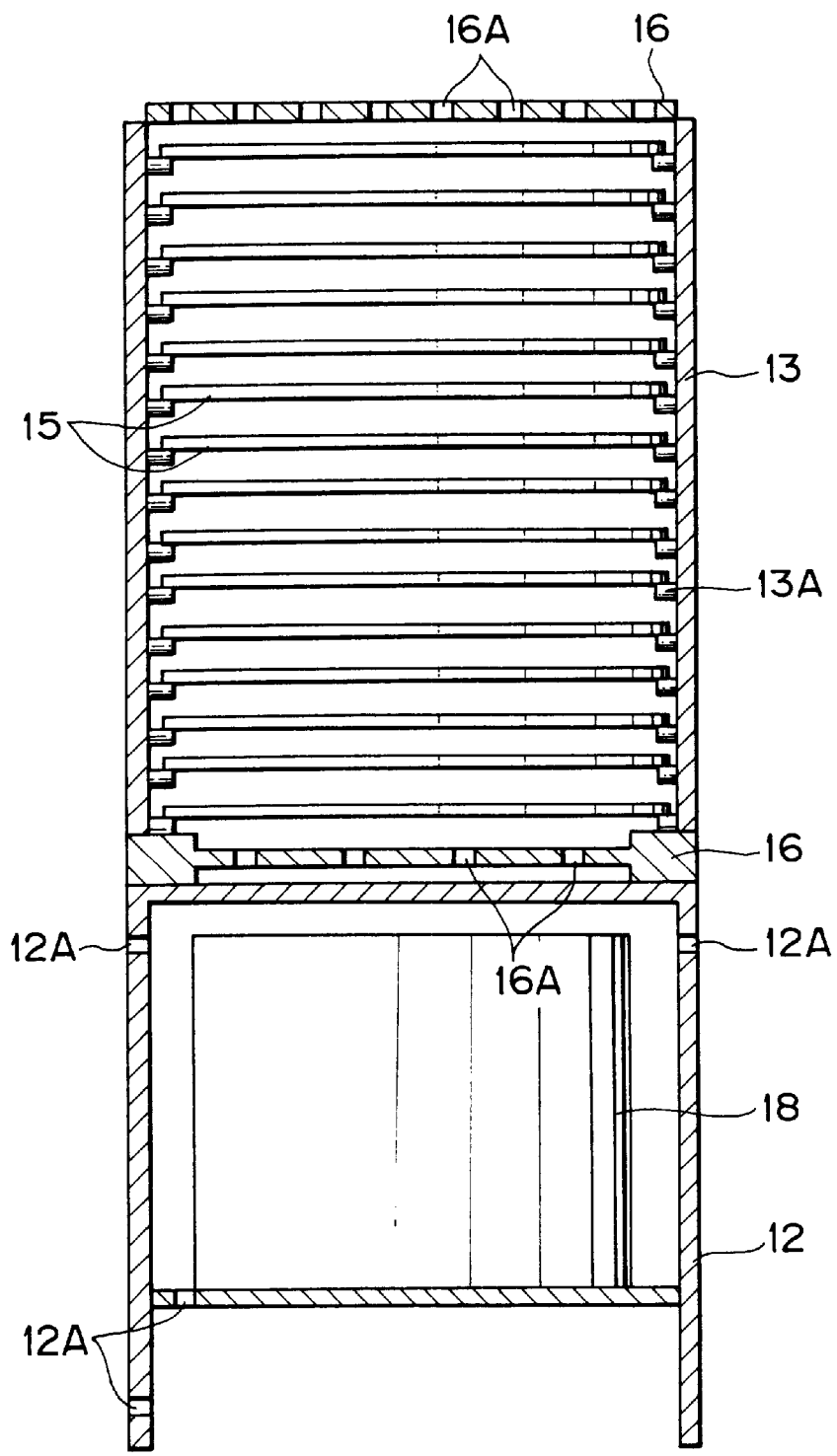
FIG. 3 is a cross sectional view of the supporting jig shown removed from the treatment apparatus.

FIGS. 1, 2 and 3 show a high-temperature and high-pressure treatment apparatus in accordance with a first embodiment and a supporting jig for use in the apparatus for batch treatment of semiconductor substrates such as Si wafers.

Referring to FIG. 1 and FIG. 2, there is shown a pressure vessel 5 formed by a pressure cylinder 1 having upper and lower openings a top lid 2 and a bottom lid 3 and a treating chamber 4 defined inside the cylinder. The pressure vessel 5, combined with the various elements described below define a furnace and furnace chamber.

In the top lid 2, a high-pressure gas inlet/outlet hole 2A is formed. The side faces of the top and bottom lids 2 and 3 are provided with engageable and disengageable press frames 6. The press frames 6 may be a yoke type, a swinging door type, or the like for withstanding the forces developed during the pressure treatment.

In the treating chamber 4, a heat insulating structure 7 having an inverted cup shape is suspended from the top lid 2 by metal fittings (not shown) or, alternatively (as described below with respect to FIG. 6) may be supported on the bottom lid 3. At the lower portion of the heat insulating structure 7 disposed inside, there is bored a gas hole 7A for allowing the pressure medium (such as argon gas and nitrogen gas) to pass therethrough and, on the inner periphery of the heat insulating structure 7, heaters 8 are arranged in upper and lower, tiers. Thus, the high-temperature and high-pressure treatment apparatus 9 is constructed.

The heater 8 is, for example, of an electric resistance wire heater type, and in order to prevent uneven temperature generating in the vertical direction of the furnace chamber, the heater is divided in a plurality of tiers in the vertical direction as shown in FIG. 2 although the configuration shown in FIG. 2 includes two tiers several more tiers can be employed such that each segment of the heater 8 can be supplied with power independently.

The bottom lid 3 is provided with an evacuation port 10 for exhausting inner air from the pressure vessel 5 and a port valve 11, movable up and down, for opening and shutting the port 10 so that the state of the gas within the furnace is switchable between a vacuum state prior to the treatment and a gas atmospheric state during the treatment.

On the bottom lid 3, a cylindrical treating stand 12 form is mounted. A supporting jig 13 is mounted on the treating stand 12 and the supporting jig 13 is surrounded by a casing 14 having an inverted cup in the shape of a bell made of an air-tight material. The casing 14 is provided to protect the substrates being treated from contamination by particles, dust and/or gas impurities that might be generated in the furnace by, for instance, the heating elements 8. The heater elements 8 are supported on inner surfaces of the casing 14 by fittings (not shown). By ascending movement and descending movement of the bottom lid 3 by means of a lifting device (not shown) the supporting jig 13 and the treating stand 12 are inserted and removed from the pressure vessel 5.

As shown in FIG. 3, the supporting jig 13 includes supporting portions 13A at predetermined spaced apart intervals with respect to the height of the furnace for supporting semiconductor substrates 15, which are the substrates to be treated. The substrates 15 can be positioned in a shelved arrangement on the supporting portions 13A at spaced apart intervals with respect to the height of the furnace, and getter materials 16 (described in greater detail below) are positioned at the top and bottom of the supporting jig 13.

The casing 14 is made of a material having an excellent heat resistance such as metal or quartz and is formed with an inverted cup shape. In the embodiment shown in FIGS. 1 and 2, the casing 14 is supported in the heat insulating structure 7 via a plate 17 that has an annular shape defining hole in the center thereof. The plate 17 is disposed at the lower end of the heat insulating structure 7. The plate 17 is connected via metal fittings (not shown) to either the upper lid 2 or the pressure cylinder 1.

In the embodiment shown in FIGS. 1 and 2, the casing 14 includes inner and outer casings 14A and 14B. The structure of the casing 14 is suitably designed depending several factors, such as the desired level of allowance for contamination by the gas and size of the apparatus. The bell-shaped casing 14, the treating stand 12 and the heat insulating structure 7 divide up the space within the pressure vessel 5 and are each provided with gas holes 14C, 12A, and 7A, respectively at portions in the pressure vessel 5 where the temperature is relatively low, i.e., at the portions near the bottom thereof so that pressure difference may not develop between outside and inside of each respective portion of the structure.

If the treating temperature is low, the supporting jig 13 may alternatively be formed of a metal such as stainless steel, quartz glass, or steel coated with a film that reaction with Si (such as a TiN film) formed thereon. On the other hand, when the treating temperature is high, it is more advantageous to use a Ni based heat insulating alloy, or in some case, a high melting point metal such as molybdenum and tungsten is recommended. In any case, because reaction with Si is undesirable, it is preferred that the surface of the support jig 13 includes covering film as described above.

Contamination by dust or gaseous contamination may create problems during the treatment of Si semiconductor substrates, and therefore the above described structures are preferably subjected to a process which reduces irregularities on the surface such as electropolishing prior to usage so that water and gas absorption are prevented. It is also recommended that a process such as supersonic cleaning be performed on the substrate before being inserted into the furnace.

The supporting jig 13 is mounted on the treating stand 12, which is formed of material selected for heat resistance and contamination resistance properties similar to the supporting jig 13. Within the treating stand 12, there is disposed a heat insulating material 18 for suppressing heat radiation toward the bottom lid 3 and preventing the lid 3 both temperature from rising to an extreme level.

Figure 4:
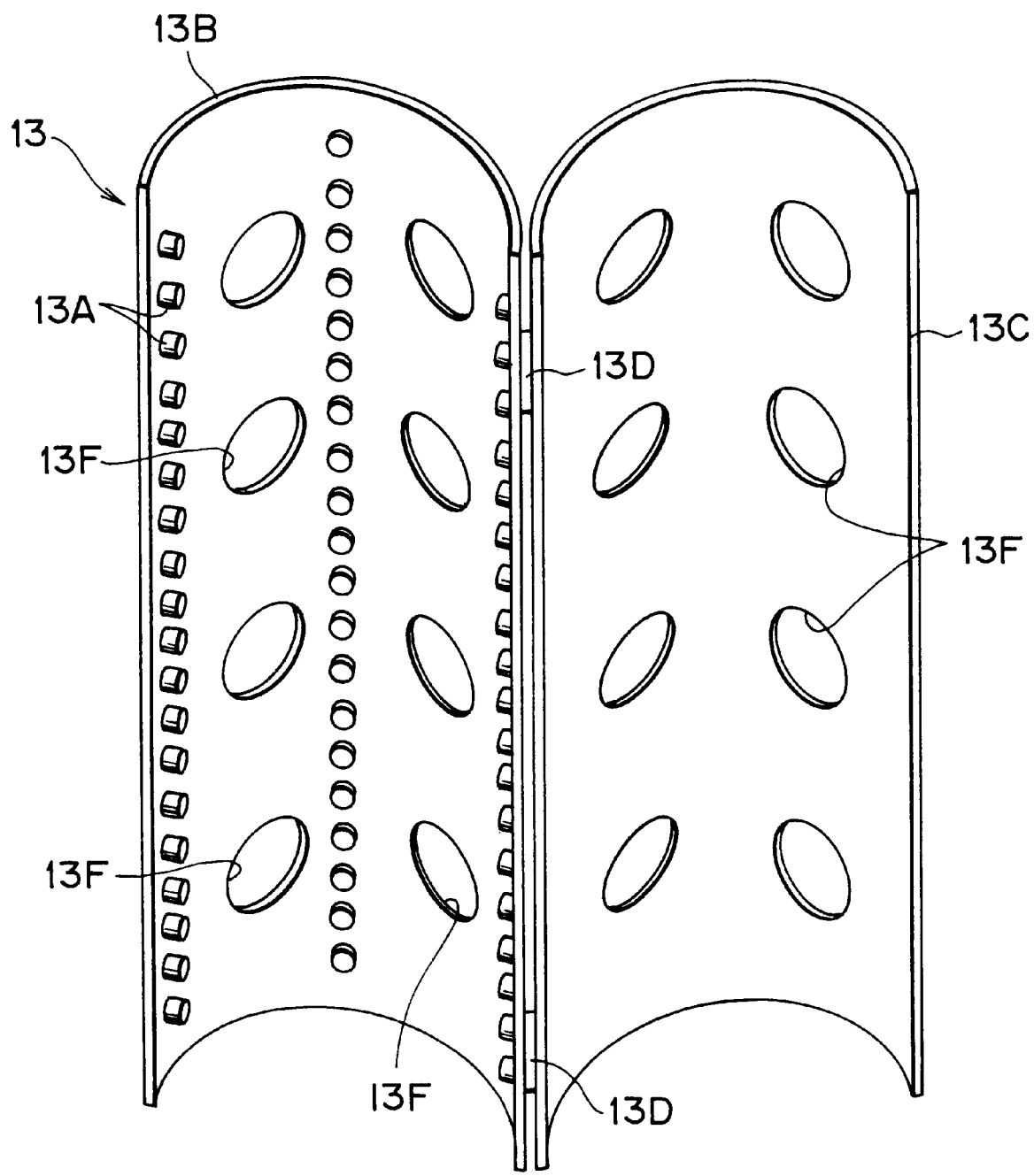
FIG. 4 is a perspective view of a portion of the supporting jig in an opened state.

The supporting jig 13, for example, is preferably made of a stainless steel pipe material vertically divided in two as shown in FIGS. 3 and 4 to produce a pair of semicircular members 13B and 13C, of which one side 13B (shown on the left in FIG. 4) is provided with the holding portions 13A. The holding portion 13A are pins for holding the Si wafers and are attached to the side 13B by screws or welding. The member 13C on the other side is configured for opening and shutting by means of hinges 13D. By making such a structure, a robot that is typically used for transferring Si wafers to the jig can be used without modification and the Si wafers can be automatically set in the supporting jig 13, one by one. After the wafers have been positioned in the member 13B, the semicircular member 13C (serving as a cover) is shut and the members 13B and 13C are locked together with a lock (not shown) to form a cylindrical shape. The supporting jib 13 is thereafter placed on the treating stand 12, and thus the wafers are ready for being treated in one lot as a unit. The bottom lid 3, the treating stand 12, and the supporting jig 13 can be inserted and removed from the pressure vessel 5 with the wafers as a single unit or combination members.

The supporting jig 13 may be provided with a predetermined number of large gas holes 13F made therein as shown in FIG. 4 for promoting heat transfer and gas convection.

Further, in order to prevent oxidization of the Si wafers during the treatment due to the presence of oxygen as an impurity in the treatment gas (argon or nitrogen), it is desirable to place an oxygen getter material 16 at the topmost position of the supporting jig 13. In the embodiment shown in FIG. 3, the getter material 16 is a titanium powder that has been formed into a disk having gas holes 16A. Of course, as the getter, sponges, foils, or formed articles of powder of titanium or zirconium may be prepared and placed on the supporting jib 13, as long as such materials do not react with the material which forms the supporting jig 13. Basically, it is effective to place the getter at a position where the gas flow by convection of the high-pressure gas is stronger or a position where the temperature is high, because as the temperature become high, the getter material reacts more strongly to absorb oxygen. In such an apparatus operated in a pressurized gas atmosphere, the high-pressure gas normally causes high natural convection and high-temperature gas tends to accumulate at an upper portion therein. Therefore, the getter is preferably placed at the top portion.

It is recommended that oxygen getter material 16 with gas holes 16A made therein be also placed around the bottom of the supporting jig 13 (at the top of the treating stand 12). Since water and the like are liable to collect at the lower portion within the pressure vessel and tend to go upward when heated, the getters are placed in corresponding positions to absorb them.

By the placement of the getter material 16, harmful effects of air and oxygen generated within the bell-shaped casing of the pressure cylinder 1, or which enter as the apparatus is opened and/or shut, can be avoided.

It is also necessary to consider oxygen that may have been present in the high-pressure gas supplied from the high-pressure gas inlet/outlet hole 2A, and water and oxygen that may have been adsorbed by an inner surface of the heat insulating structure 7 and the pressure vessel 5 when the overall pressure vessel is opened for repairs. Although the oxygen present in the above described circumstances can be removed by the getter material 16 placed within the bell-shaped casing 14, it is preferred that measures be taken to prevent oxygen from entering when the bell-shaped casing 14 is pressurized. Although complete removal of oxygen is difficult, in order to remove oxygen included in the gas flowing into the bell-shaped casing 14 via spaces inside the heat insulating structure 7, it is desirable to divide the bell-shaped casing 14 into the inner and the outer casing 14A and 14B to thereby form a gas passage 14D therebetween as shown in FIGS. 1 and 2, provide a gas entrance/exit (gas hole) 14F at the top of the inner casing 14A as shown in FIGS. 1–2, and place the getter material 16 nearby there or a side face thereof where the temperature is high.

The pressure vessel 5 is regularly opened for maintenance of the apparatus, and the pressure vessel 5 is also unavoidably opened when Si wafers are inserted into the apparatus. As a countermeasure against air then flowing in, it is also preferable that the following two methods be used.

Figure 5:
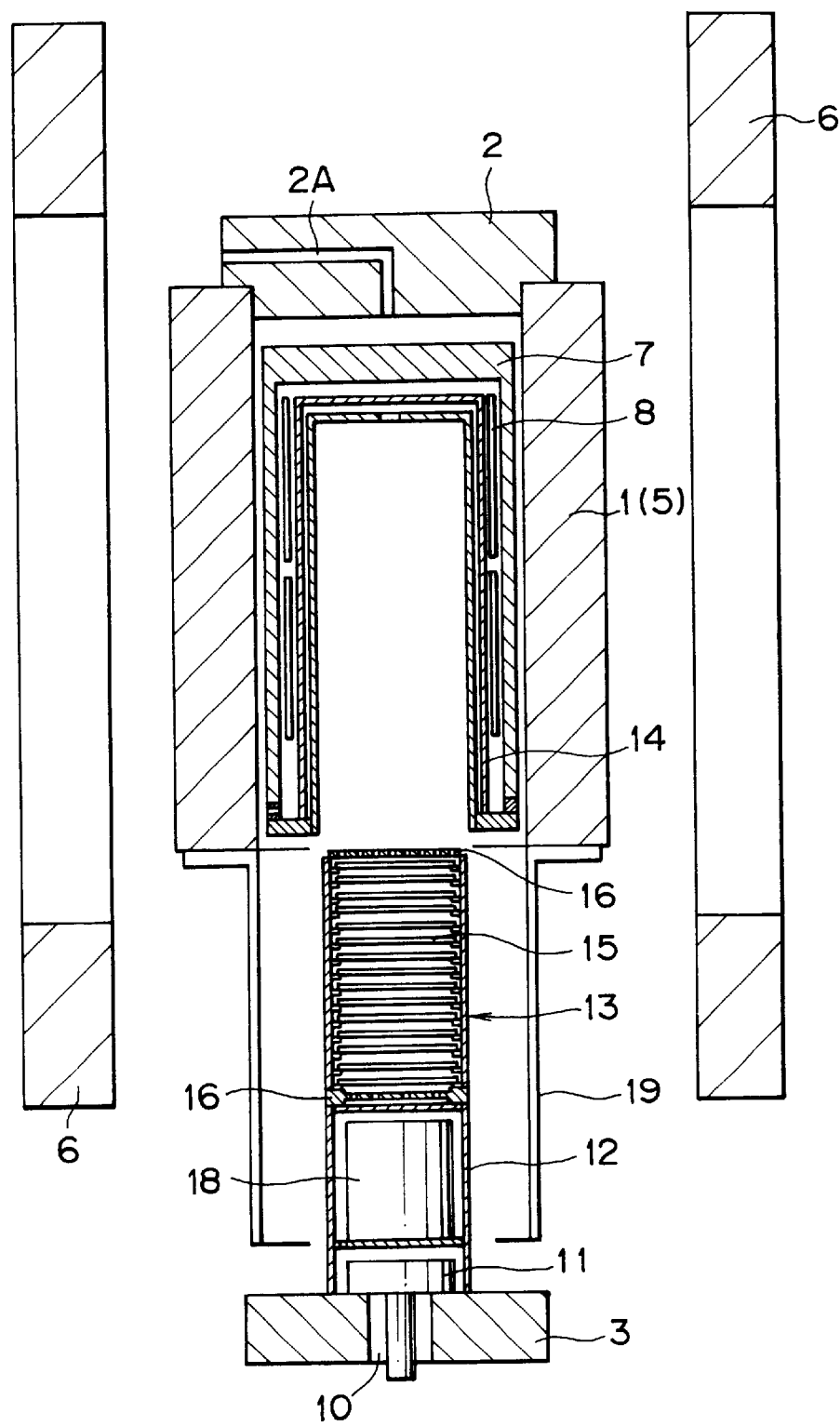
FIG. 5 is a sectional view of a portion of the treatment apparatus showing the supporting jig and substrates lowered from a portion of the treatment apparatus in installation and removal operations.

First, since the opening portion of the vessel, i.e., the bottom lid 3 in the example of FIG. 1, is pulled down when Si wafers (as the articles to be treated) are inserted and removed, it is advantageous to cover the circumference of the lower opening portion with a cover such as or a housing 19, shown in FIG. 5, formed of an airtight material such as a metallic plate or a resin plate and perform the work with an inert gas such as nitrogen or argon flowing inside. Good results can be obtained at this time by injecting a gas flow from the high-pressure gas inlet/outlet hole 2A formed in the top lid 2 of the pressure vessel 5.

Second, in order to remove air mixed in the pressure vessel 5 or water mixed in and adsorbed by the members within the pressure vessel or the inner surface of the pressure vessel at the time when the supporting jig 13, with the articles or Si wafers to be treated in one lot as a unit in a shelved arrangement, are inserted into the treating chamber by means of the treating stand 12 and opening is sealed by installation of the bottom lid 3B, it is effective to evacuate the pressure vessel of the air and water. When it is desired to perform this work in a short time, it is especially preferred that the evacuating port 10 in the form of a large bore be provided in the bottom lid 3B. As a standard, a bore of $\frac{1}{20}$ to $\frac{1}{10}$ of the inner diameter of the pressure vessel is recommended. Although it depends on the length of the pressure vessel 5, if the height is around two to three times as large as the inner diameter of the pressure vessel, by selecting the bore of the evacuating port 10 of the aforesaid dimension and using a large capacity vacuum pump (a dry pump that does not produce oil smoke is preferred), a vacuum less than 1 Pa can be obtained by about 15 minutes of evacuation. In this case a high water removing effect can be obtained.

When structure members within the pressure vessel 5 are repaired, not only is the overall interior of the pressure vessel 5 exposed to the air but also members newly attached to the interior that have long been exposed to ambient air. In order to effectively remove air and water mixed in from such causes, it is preferred that evacuation be made also from the top lid portion. At this time, it is desired to provide a dedicated port there but it might be restricted by the space available. In such case, making evacuation through the high-pressure gas inlet/outlet hole 2A will produce desirable effects to a certain degree.

Further, in the fabrication of ULSI semiconductor wafers, dust (particles) attaching to the wafers not only affects the performance but also greatly affects the yield of the products. Therefore, careful consideration must also be given to this problem. The dust of concern related to the operation of the apparatus of the present invention includes dust flowing in from a gas source (generally, a gas container) of the high-pressure gas as a treating medium and dust resulting from changes in quality and wear of the heater 8 and the heat insulating material of the heat insulating structure 7 caused by heating and sliding due to, for instance, thermal expansion and contraction. As the material of the various structures, such a material that will produce least of such dust should be selected and the structure should be designed to have no sliding portions. However, since dust unavoidably produced, it is recommended that a filter be provided on the passage from the gas source to the interior of the bell-shaped casing. Since dust of a size of 0.1 $\mu$m or less, generally, causes trouble with semiconductors, such a filter having smaller mesh than that is to be selected.

Against the flow in of the dust from the gas source, a filter is provided halfway through the pipe connecting the gas source and the pressure vessel. Further, it is recommended that a small-meshed filter F be provided at the inlet 2A of the pressure vessel as indicated in FIG. 2. Also for the gas passages communicating with the bell-shaped casing, it is recommended to provide filters F1 and F2 as shown in FIG. 2 at the gas holes 7A and 14C.

Figure 6:
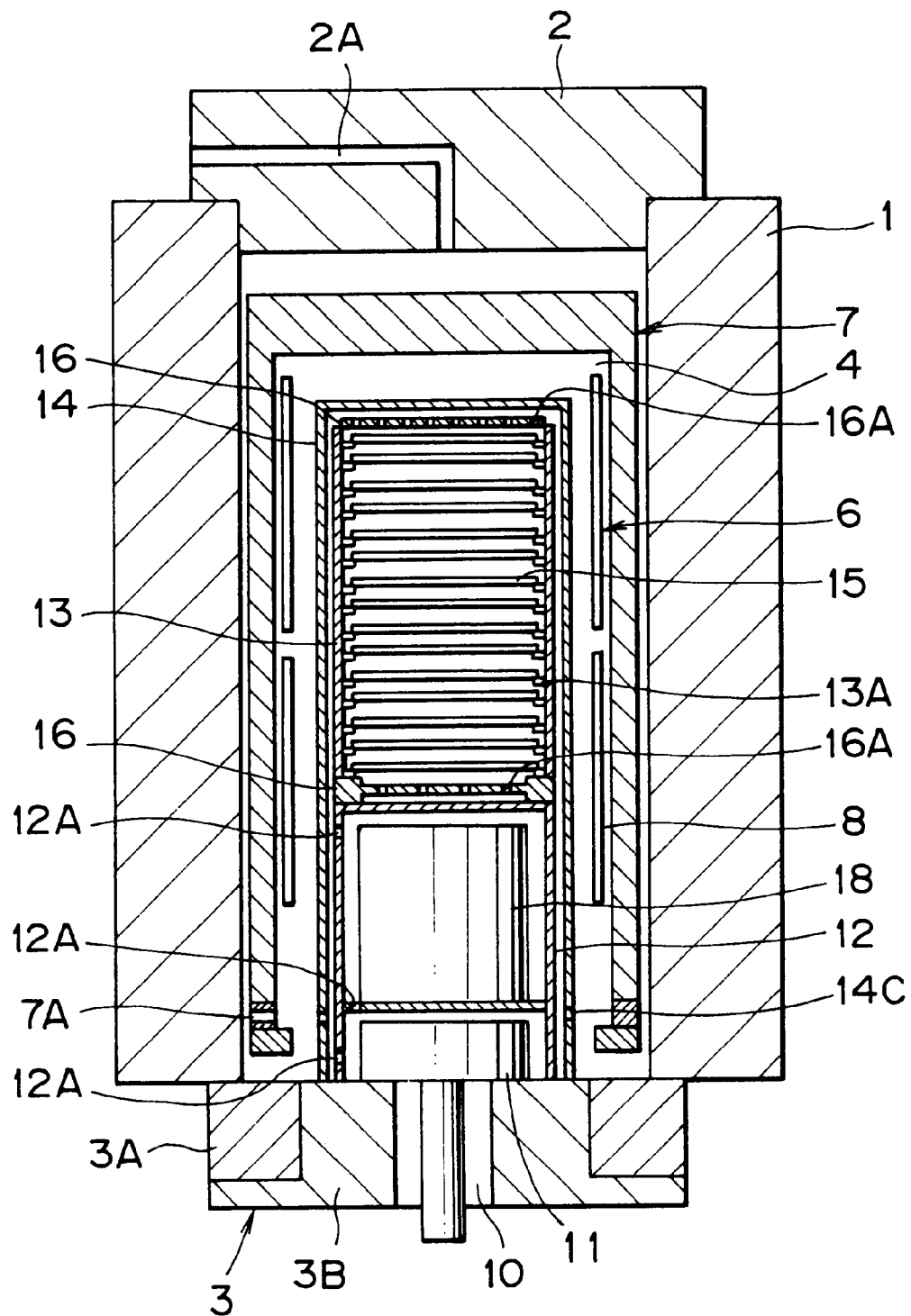
FIG. 6 is a cross sectional view of a treatment apparatus in accordance with a second embodiment of the present invention.
Figure 7:
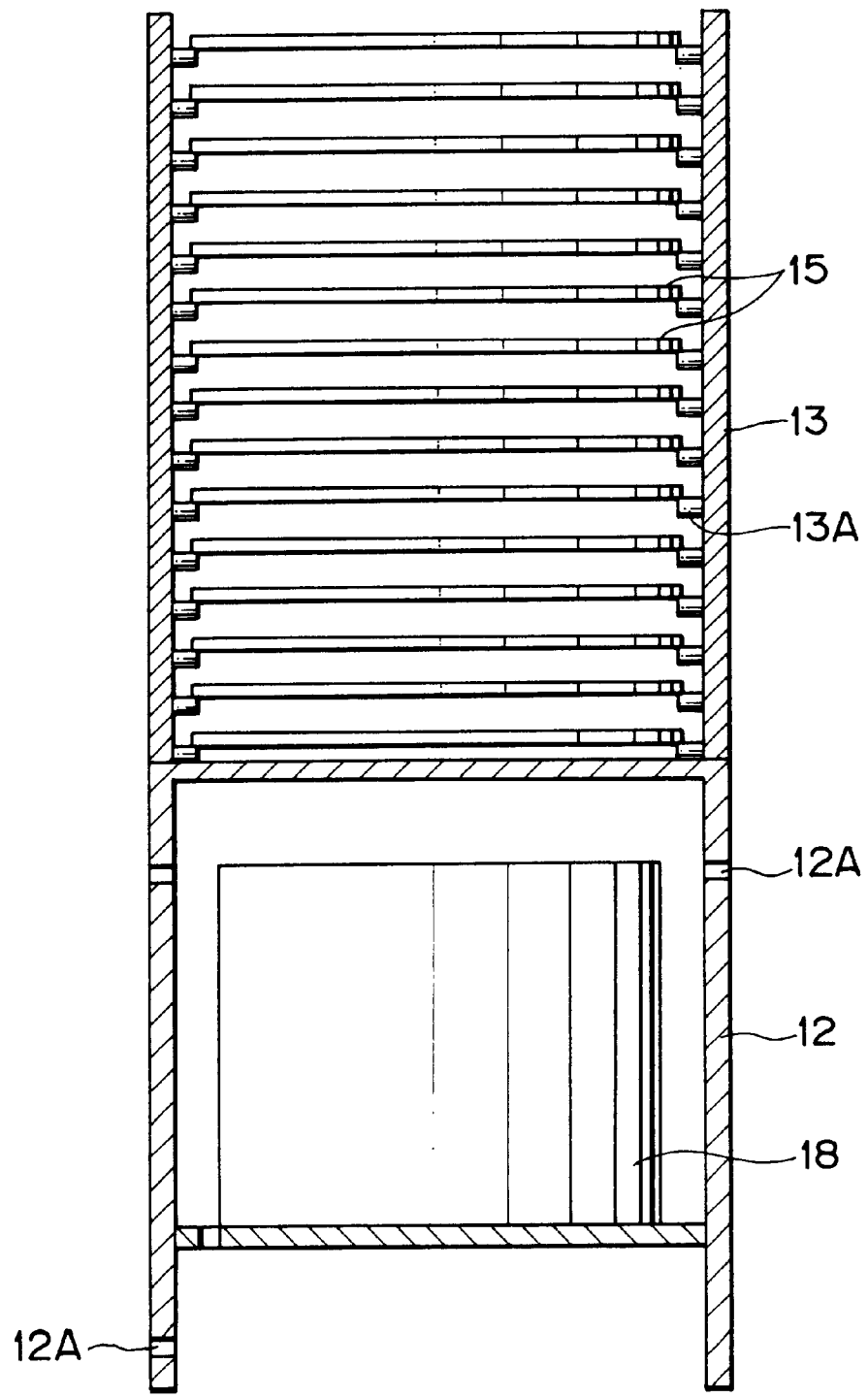
FIG. 7 is a cross sectional view of a supporting jig in accordance with the second embodiment.

FIG. 6 and FIG. 7 show a second embodiment of the present invention. FIG. 6 shows a structure of the bottom lid 3' divided into an upper bottom lid 3A having a ring or annular shape fixed to the pressure cylinder 1 and a lower bottom lid 3B removably fitted in the upper bottom lid 3A. In the second embodiment, the upper bottom lid 3A is fixed to the pressure cylinder 1. The heat insulating structure 7 and the bell-shaped casing 14 are supported by the upper bottom lid 3A. Therefore, by ascending movement and descending movement of the lower bottom lid 3B by means of a lifting device (not shown), it is possible to install and remove the supporting jig 13 and the treating stand 12 into and out of the treating chamber 4.

Although the casing 14 is illustrated as one-layered one in FIG. 6, it may also be that having the casing divided into an outer and an inner casing as described above with respect to the first embodiment shown in FIGS. 1–5.

FIG. 6 shows a second embodiment of the supporting jig 13 that has getter material 16 disposed at both upper and lower portions thereof. Although it is not shown in FIG. 7, the trunk portion of the supporting jig 13 has gas holes (13F) made therein and is of a separable structure formed of semicircular members as described above with respect to FIG. 4 and the first embodiment.

The supporting jig 13 shown in FIG. 7 is such that it may be effectively used when a getter material 16 is placed, near the gas passage 14D or the gas hole 14F with the casing 14 formed with the inner and outer casings 14A and 14B.

Further, though it is not shown, there is preferably a water cooling jacket mounted on the outer periphery of the pressure cylinder 1 for passing water therethrough to prevent the temperature of the pressure cylinder from rising too high due to heat generated within the vessel. Further, if the high-pressure treating gas is nitrogen or argon, it is preferred that the getter material is formed of titanium when the high-pressure treating gas is nitrogen and if the high-pressure treating gas is argon, the getter material is preferably formed of titanium or zirconium.

Figure 8:
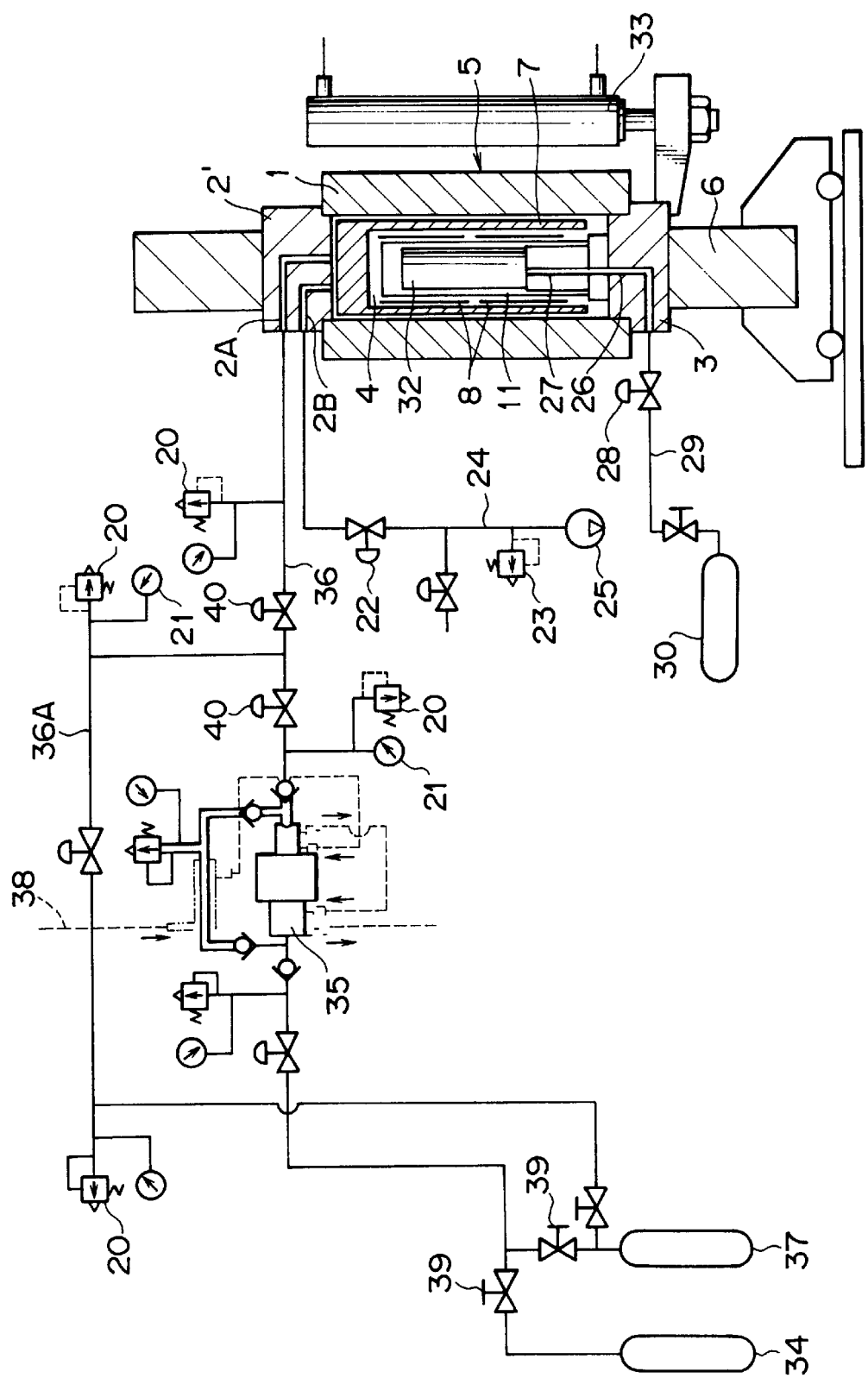
FIG. 8 is a schematic diagram showing an overall structure of a high-temperature and high-pressure treatment apparatus in accordance with a third embodiment of the present invention.
Figure 9:
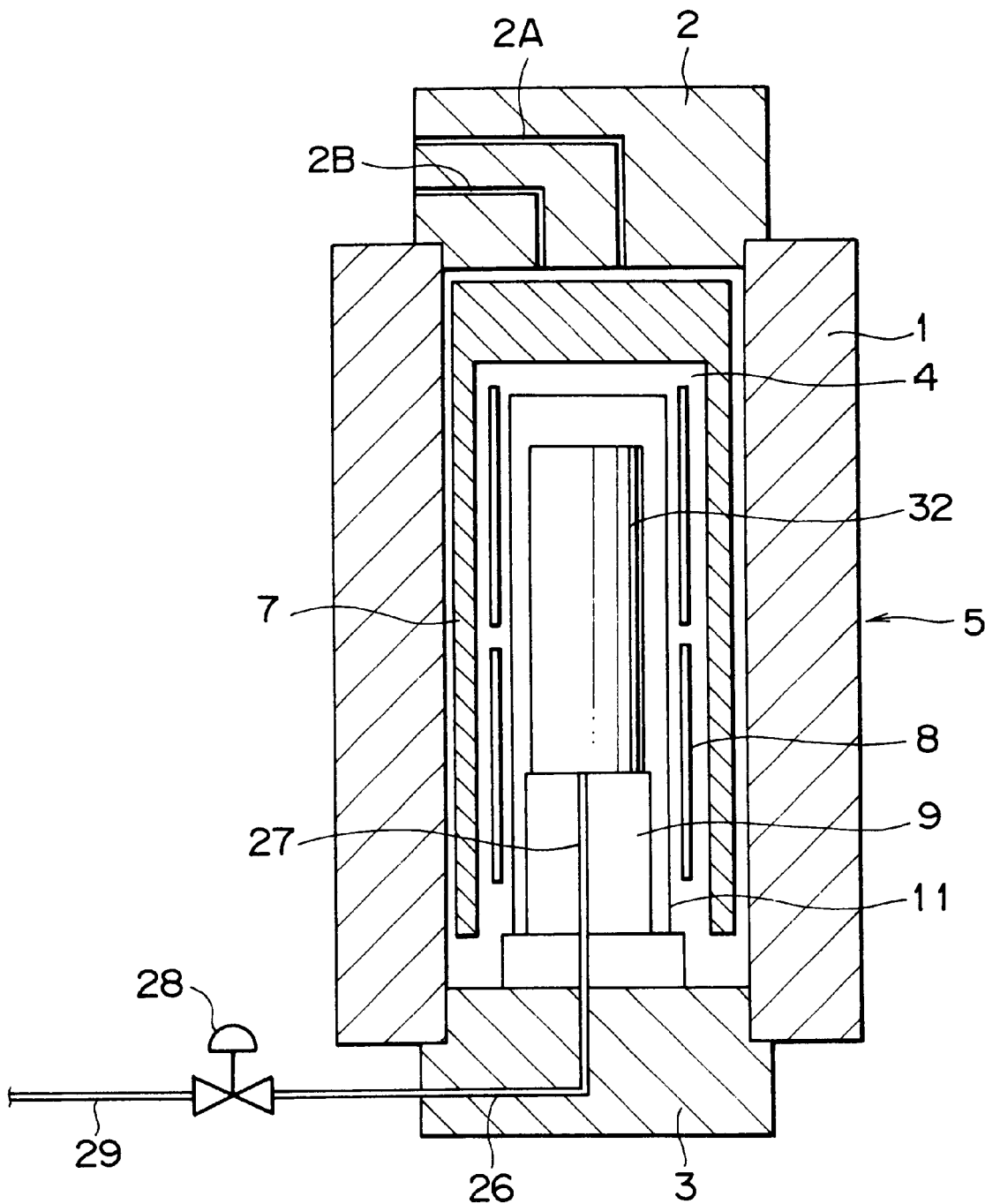
FIG. 9 is a vertical cross sectional view of the high-temperature and high-pressure treatment apparatus depicted in FIG. 8.

FIG. 8 and FIG. 9 show a high-pressure gas processing apparatus and a high-temperature and high-pressure treatment apparatus in accordance with a third embodiment of the present invention.

In FIG. 8 and FIG. 9, a pressure vessel 5 is formed of a pressure cylinder 1 in a cylindrical shape with an upper and a lower opening thereof shut by a top lid 2' and a bottom lid 3 and a treating chamber 4 defined therein similar to those described above with respect to the first and second embodiments.

The top lid 2' has a high-pressure gas inlet/outlet hole 2A and an evacuating hole 2B formed therein. The side faces of the top and bottom lids 2' and 3 are provided with engageable and disengageable press frames 6 of a yoke type, a swinging door type, or the like for withstanding the thrust forces developed during the pressure treatment.

Within the treating chamber 4, an insulating structure 7 and a heater 8 are provided that are generally the same as in the first embodiment.

On the bottom lid 3, there are mounted a furnace pedestal 9 and articles to be treated 32 via the furnace pedestal 9. The articles to be treated 32 are housed in an inverted cup-shaped (bell type) casing 14 formed of an airtight material excellent in heat resistance such as metal or quartz. By raising and lowering the bottom lid 3 by means of a lifter 33, such as a hydraulic cylinder, the articles to be treated 32 together with the casing 14 can be moved into and out of the treating chamber 4 within the furnace.

The high-pressure gas inlet/outlet hole 2A is connected to an accumulator 34 of inert gas, such as argon and nitrogen, via a pipe 36, and a pressurizing means 35, such as a reciprocating type compressor, is also connected to the high pressure inlet/outlet hole 2A such that the treating chamber 4 is supplied with a high-temperature and high-pressure inert gas atmosphere in order to treat the articles 32 under pressure.

The pressurizing means 35 includes a by-pass circuit 36A across the same, whereby gas recovered from the treating chamber 4 may be stored in a gas container 37, and the pressurizing means 35 is provided with a cooling means 38 using cooling water. The pipe 36 is provided with an opening/shutting valve 39, a stop valve 40, a safety valve 20, a pressure gage 21, and so on as shown in FIG. 8.

The evacuation hole 2B is connected with a vacuum pump 25 through a pipe 24 having a stop valve 22 and, a safety valve 23.

Further, the bottom lid 3 is provided therein with a gas passage (gas inlet) 26. The passage 26 communicates with the treating chamber 4 through a passage 27 provided in the furnace pedestal 9. The passages 26 and 27 are connected with a pipe 29, including a magnetic stop valve 28, and the pipe 29 communicates with a reducing gas container 30.

The reducing gas container 30, valve 28 and pipe 24 define a reducing gas supplying pipe system 29 for a reducing process in which a reducing gas is introduced into the treating chamber 4 prior to the pressurization with the high-pressure gas. The reducing gas supplying circuit including the pipe system 29 is provided with the stop valve 28.

The reducing gas, such as hydrogen, is supplied to the treating chamber 4 prior to the pressure treatment at a pressure around the atmospheric pressure, and preferably less than 1 MPa, is generally sufficient. The reducing gas is injected from the reducing gas container as a gas supplying source by operating the stop valve 28. The stop valve 28 is provided for shutting off high pressure of several hundred MPa during the high-pressure treatment thereby preventing the reducing gas cylinder 30 from being damaged. It is recommended that a safety valve (not shown) operating in the event of leaking in of the high-pressure gas also be provided on this circuit.

Figure 10:
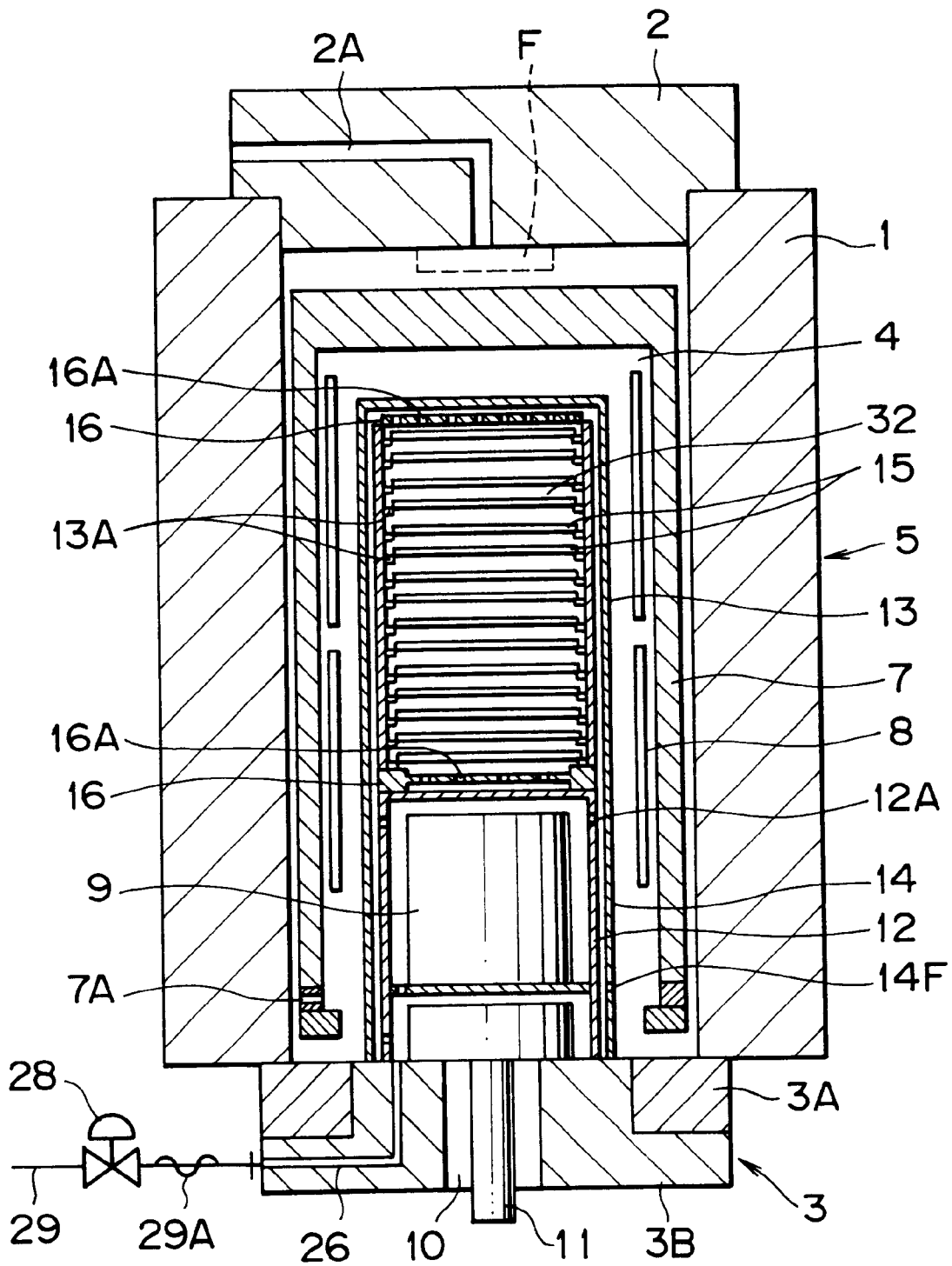
FIG. 10 is a cross sectional view of a high-temperature and high-pressure treatment apparatus in accordance with a fourth embodiment of the present invention.

FIG. 10 shows a fourth embodiment of the present invention, in which, many elements and structures correspond to the structures and elements described above with respect to the embodiment shown in FIG. 6, FIG. 8, and FIG. 9. Therefore, those portions denoted by reference numerals, corresponding to previously described elements are not described again, but rather, only features that differ from the above described embodiments are described in detail above.

The top lid 2 is provided therein with a high-pressure gas inlet/outlet hole 2A. The bottom lid 3 is formed of an upper bottom lid 3A shaped in a ring form and fixed to the bottom end face of the pressure cylinder 1 and a lower bottom lid 3B removably fitted in the upper bottom lid 3A. The lower bottom lid 3B is provided therein with an evacuating port 10 and the port 10 is provided with a port valve 11 for opening and shutting the port 10.

The lower bottom lid 3B is provided therein with an inlet hole 26 for introduction of a reducing gas such as hydrogen. The reducing gas is injected into the bell-shaped casing 14 and the gas generated in the reducing process (which is water when the reducing gas is hydrogen) is exhausted, prior to the pressure treatment with the high-pressure gas, through the evacuating port 10 opens into the space within the bell-shaped casing 14 by operating the port valve 11, and thereby the reducing gas generated into the treating chamber containing the heater and others can be easily evacuated. Especially when hydrogen is used as the reducing gas, the generated water (vapor) is removed most effectively by evacuation.

Since the lower bottom lid 3B is moved up and down for moving the semiconductor substrates 15 into or out of the treating chamber 4 through the use of the supporting jig 13, it is preferred that the pipe 29 is provided with a flexible pipe 29A.

When the pressure vessel 5 is opened for maintenance of the apparatus, or when Si wafers as the articles to be treated are charged into the apparatus, the pressure vessel 5 is unavoidably exposed to the air. Also as the countermeasure against the air flowing in at this time, the injection of the reducing gas is effective.

Figure 11:
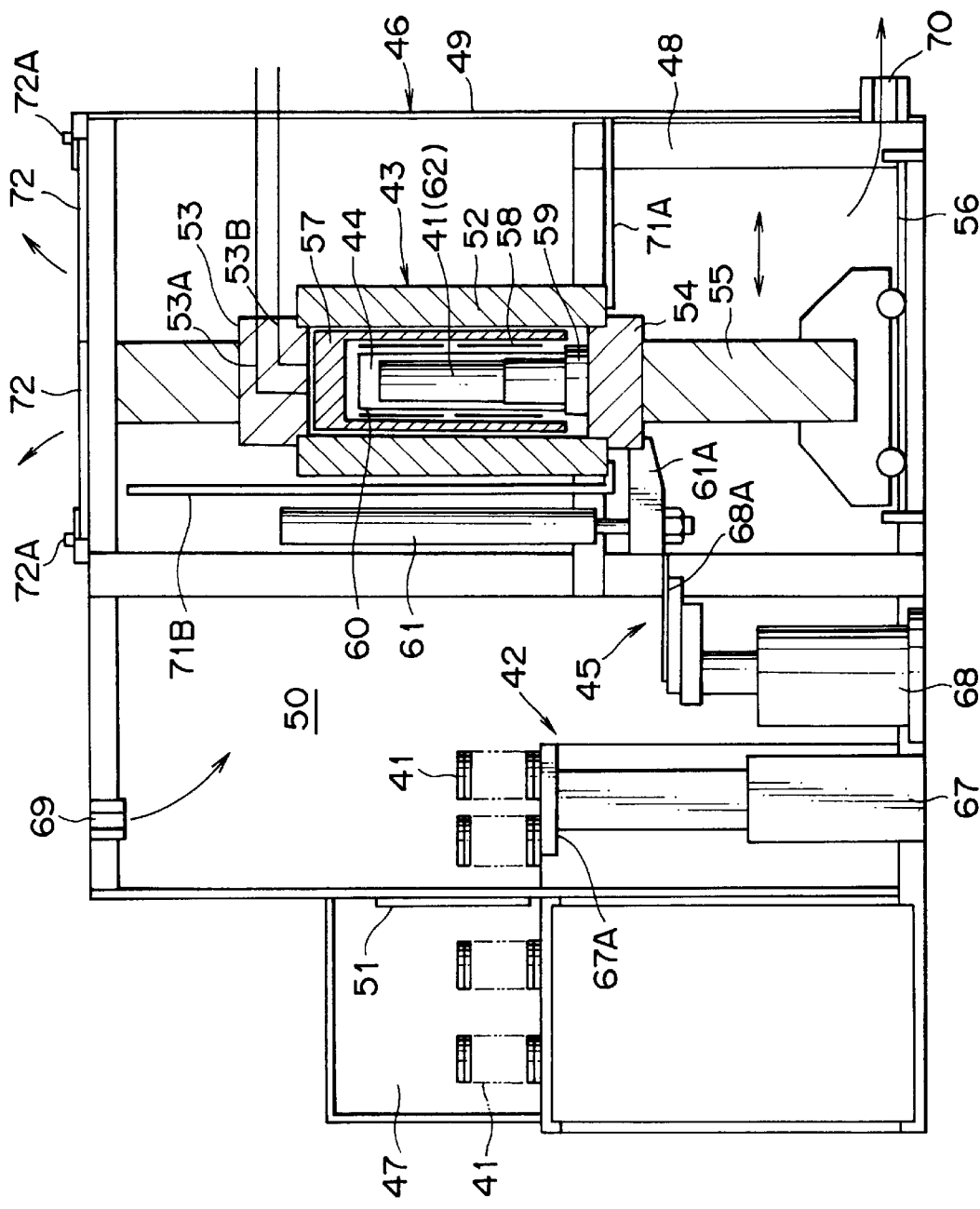
FIG. 11 is a front elevation showing an overall structure of a fifth embodiment of the present invention.
Figure 12:
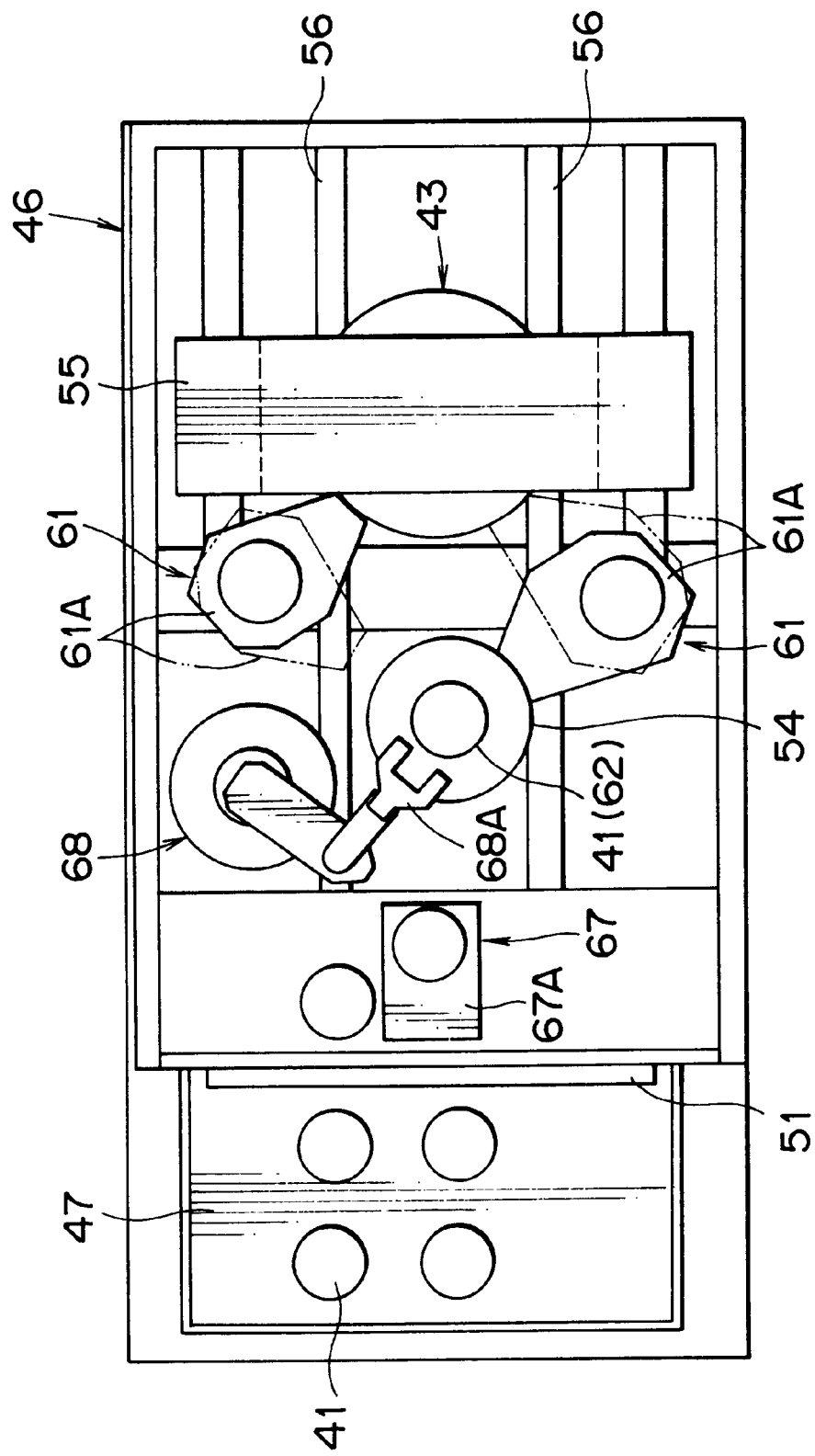
FIG. 12 is a top plan view of the treatment apparatus depicted in FIG. 11.

A general structure of the fifth embodiment of the invention is shown in the elevation of FIG. 11 and a plan view of FIG. 12. Referring to the drawings, a stocking portion 42 for maintaining substrates 41 in stock and a transport means 45 for moving the substrates 41 on the stocking portion 42 into and out of the treating chamber 44 within the pressure vessel 43, together with the pressure vessel 43, are housed in an airtight housing 46.

The substrate 41 here is a semiconductor substrate of for example, an Si wafer or the like which is provided with a wiring film of a metallic material such as copper (including both pure copper and copper alloy), aluminum (including alloy), silver, or the like formed thereon by sputtering, plating, or the like. Twelve to twenty-five sheets of the substrates are contained as one lot generally in a resin cassette. The cassette can be mounted by means of a transport apparatus or manual work on a load port 47 formed on one side of the housing 46.

As the transport apparatus, an OHT (Overhead Hoist Transportation) and an AGV (Automated Guided Vehicle) can be employed but the transport apparatus is not limited to these.

The housing 46 forms a box-like containing chamber 50 by having an airtight external supporting member 49 mounted on a frame 48. Between the load port 47 and the stocking portion 42, a door 51 is provided, the door 51 may be of a slide type or a double-leafed hinged type. The substrates 41 in the load port 47 can be placed on the stocking portion 42 by opening and shutting the door 51.

On the frame 48, there is fixed upright a cylindrical pressure cylinder 52. The pressure vessel 43 is formed by having the openings of the pressure cylinder 52 at the top and bottom sealed by a top lid 53 and a bottom lid 54 thereby defining a treating chamber 44 in the pressure cylinder 52.

The top lid 53 is provided with a high-pressure gas inlet/outlet hole 53A and an evacuation hole 53B formed therein. The side faces of the top and bottom lids 53 and 54 are provided with engageable and disengageable press frames 55 for carrying the thrust forces developed when a pressure treatment is in progress. Although the press frame 55 is shown as a yoke type that travels (sliding) on rails 56 in FIG. 11, it can be of alternate design.

Figure 13:
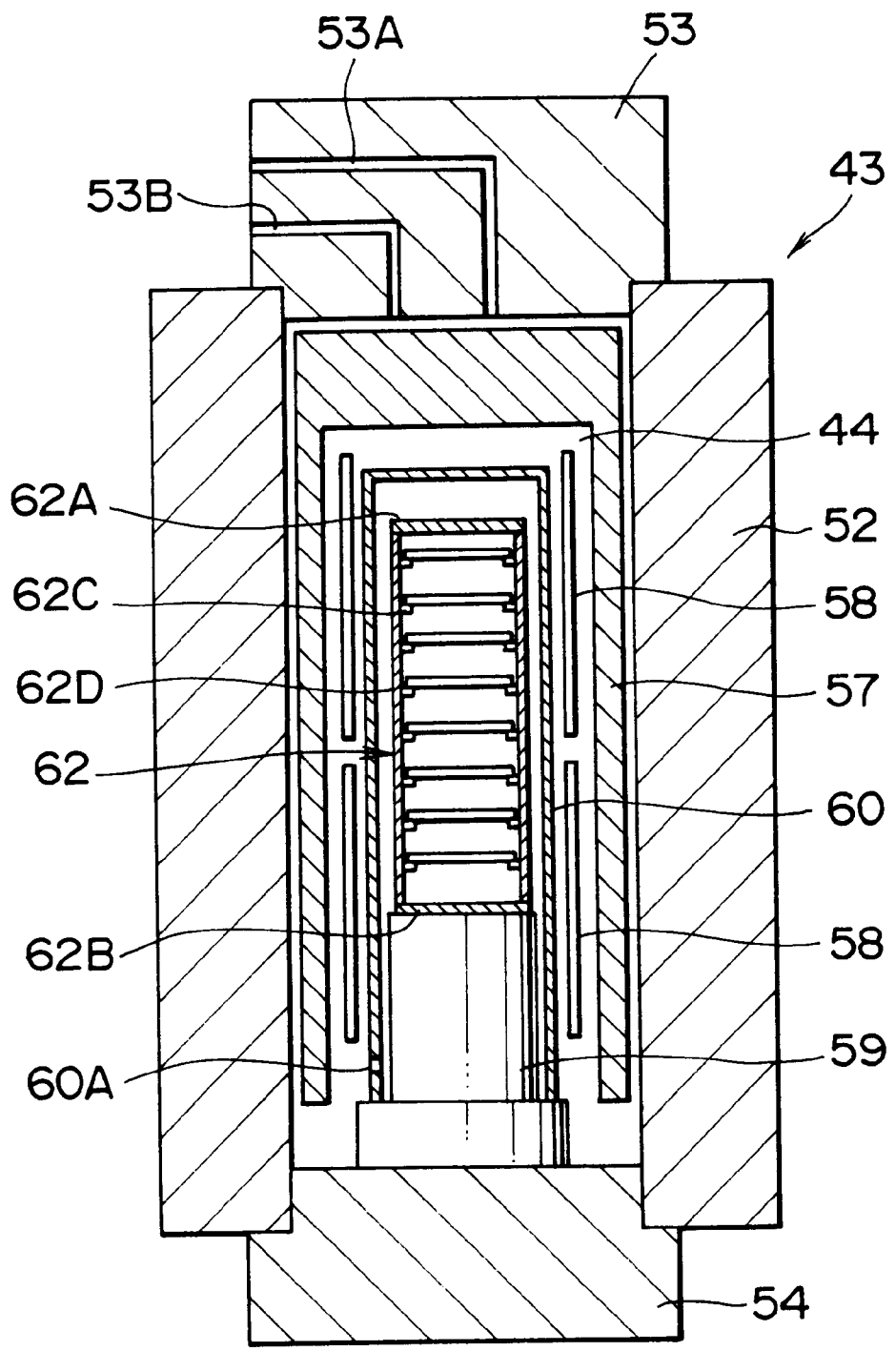
FIG. 13 is a cross sectional view showing a first example of the high-temperature and high-pressure treating pressure vessel used in the fifth embodiment.

As shown in FIG. 13, there are provided a heat insulating structure 57 and a heater 58 within the treating chamber 44 in a manner similar to the above described embodiments. On the bottom lid 54, the furnace pedestal 59 and the substrates 41 via the furnace pedestal 59 are mounted. The substrates 41 are surrounded by an inverted cup-shaped (bell-type) casing 60 formed of an airtight material that is excellent in heat resistance, such as metal or quartz. By raising and lowering the bottom lid 54 by means of a lifter apparatus 61, such as a hydraulic cylinder, the substrate 41, the furnace pedestal 59, and the casing 60 can be taken as a unit into and out of the treating chamber 44 within a furnace defined by within the pressure cylinder 52.

The substrates 41 are set in the supporting jig 62 in a shelved arrangement as shown in FIG. 13. The supporting jig 62 is formed with a top and a bottom end plate 62A and 62B and bar members 62D connecting both the end plates. Each bar member is provided with supporting pins 62C. The end plates 62A and 62B and bar members 62D form the supporting jig 62 in a structure that defines a cassette and are formed of a heat insulating material. The supporting jig 62 is substantially surrounded by the casing 60. The casing 60 is provided with gas holes 60A made in its lower portion. By the provision of the casing 60, contamination from the heater 58 and the like can be prevented.

Figure 14:
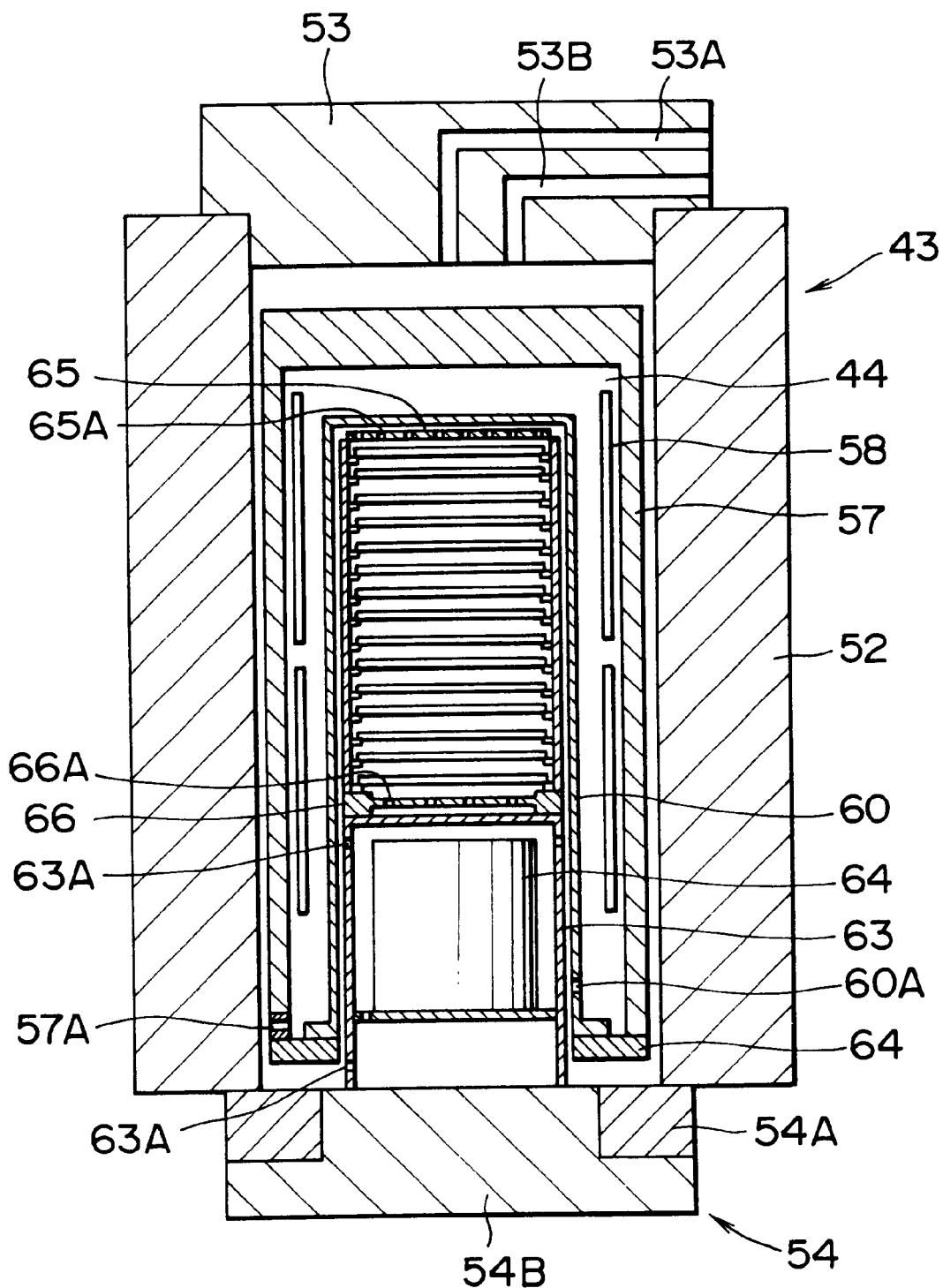
FIG. 14 is a cross sectional view showing a second example or modification of the high-temperature and high-pressure treating pressure vessel employed in the fifth embodiment.

In a modified pressure vessel 43 shown in FIG. 14, the bottom lid 54 is divided into an upper bottom lid 54A fixed to the bottom end of the pressure cylinder 52 and the lower bottom lid 54B removably fitted into the upper bottom lid 54A. On the lower bottom lid 54B, there is mounted a cylindrical treating stand (corresponding to the furnace bottom) 63. On the treating stand 63, there is disposed the supporting jig 62 with the substrates 41 set therein in a shelved arrangement. The casing 60 surrounding the supporting jig 62 is mounted on a ring-shaped supporting plate 64 fixed onto the bottom of the heat insulating structure 57.

Accordingly, in the treating chamber 44 within the pressure vessel 43 shown in FIG. 14, the supporting jig 62 together with the treating stand 63 can be taken into and out of the treating chamber 44 through the bottom portion of the same, with the casing 60 left in the treating chamber 44, by ascending and descending motion of the lower bottom lid 54B.

In FIG. 14, the treating stand 63 is provided therein with an insulating material 64 to prevent the temperature from rising to an extreme level. A hole 57A is made at the lower portion of the insulating structure 57, a hole 60A made in the casing 60, and a hole 63A made in the treating stand 63, such that pressure is equalized or balanced between the inner part and outer part of the portion where the temperature is relatively low within the pressure vessel 43.

As shown in FIG. 11 and FIG. 12, the stocking portion 42 is provided adjacent to the load port 47. The stocking portion 42 has a stocking table 67A on an elevator 67 for raising and lowering the substrates 41. The substrates 41 contained in the cassette are mounted on the stocking table 67A and ascend and descend by the operation of the elevator 67.

Between the elevator 67 and the bottom lid lifting and turning apparatus 61, there is disposed a shifting and mounting robot (shifting and mounting apparatus) 68 configured to raise and lower and turn operation round a vertical axis the substrates 41. The robot 68 has a handling arm 68A at an upper portion thereof. The elevator means 67, the shifting and mounting apparatus 68, and the bottom lid lifting and turning apparatus 61 are all components of a transport apparatus 45 for taking the substrates to be treated 41 on the stocking portion 42 into and out of the treating chamber 44 within the pressure vessel 43.

It is advantageous to configure the transport means 45 such that the bottom lid 54 of the pressure vessel 43 and the furnace pedestal 59 disposed on the bottom lid 54 plus the substrates 41 supported on the bottom lid 54 via the furnace pedestal 59 are moved, as a unit, into and out of the pressure vessel 43 from below. It should be understood that the substrate 41 could alternatively be taken in and out from above the pressure vessel 43 through an upper opening.

Further, the transport apparatus 45 may also be alternatively be configured such that the shifting and mounting apparatus 68 is eliminated therefrom by arranging the bottom lid lifting and turning apparatus 61 such that the arm 61A provided at the bottom portion thereof makes turning movements in addition to raising and lowering movements. It is advantageous to have the transport means 45, as shown in FIGS. 12 and 13 where both the bottom lid lifting and turning apparatus 61 and the shifting and mounting apparatus 68 disposed between the apparatus 61 and the stocking portion 42 are included for shifting the substrates 41 from the stocking portion 42 to the bottom lid lifting and turning apparatus 61.

Further, it should be appreciated that the bottom lid 54 (including the lower bottom lid 54B), the furnace pedestal 59 disposed on the bottom lid 54, the supporting jig 62 disposed on the furnace pedestal 59 and the substrates 41 in a shelved arrangement in the supporting jig 62 may be provided as a single unit,, and may be moved by the bottom lid lifting and turning apparatus 61 and, further, as shown in FIG. 12, at least two sets of the bottom lid lifting and turning apparatus 61A are included and capable of making operations independent of each other. By this design, it becomes possible to set the substrates 41 in the supporting jig 62 on the bottom lid lifting and turning apparatus 61A in a standby position, while a plurality of sheets of substrates 41 are being treated under high-temperature and high-pressure conditions in the treating chamber 44 within the pressure vessel 43. Thus, productivity can be greatly improved.

According to the basic structure, one lot or unit of the substrates 41 are stocked and contained in a resin cassette and the substrates 41 in the cassette are set in the supporting jig 62. However, if a heat insulating supporting jig 62 is used in place of the resin cassette for stocking the substrates on the stocking portion 42, the substrates 41 on the stocking portion 42 can be directly moved into and out of the treating chamber 44 while being contained in the supporting jig 62. In other words, the resin cassette may be replaced by the supporting jig 62 in the present invention, such that stocked substrates 41 are stored in a plurality of supporting jigs 62, each supporting jig 62 filled with substrates 41.

Further, in FIG. 11, the housing 46 for housing the pressure vessel 43 and other portions of the present invention is provided with a gas flow inlet 69 and a gas flow outlet 70 for providing flow protecting gas (air or inert gas such as nitrogen) through the housing 46. In the case shown, the gas flow inlet 69 is provided at one side of the top of the housing 46 and the gas flow outlet 70 is provided at the bottom of the housing 46 toward the side opposite to the gas inlet 69. If it has been determined that there is no problem arising by exposing the substrates 41 to the air, then filtered air free of dust (particles) is injected as the protecting gas into the housing 46 from the gas flow inlet 69 so that the air flows downward and exhausts through the gas flow outlet 70.

It is preferable to use a filter with meshes below 0.01 μm in case of semiconductor for capturing particles in the gas supplying circuit up, the filter being disposed proximate the gas flow inlet 69.

Further, as shown in FIG. 11, shielding members 71A and 71B are provided in the containing chamber 50 within the housing 46 at the bottom and the side of the pressure vessel 43.

Namely, all of the components of the pressure vessel 43 except for the bottom lid 54 are separated and shielded by the shielding members 71A and the 71B from all other components in the housing 46. The shielding members 71A and 71B are provided for preventing small particles from attaching to the substrates 41 within the containing chamber 50, where the particles come from such sources of dust within the housing 46 as the sliding portions between the press frame 55 and the top lid 53, the bottom lid 54, and the sliding portions within the bottom lid lifting and turning apparatus 61 where wearing friction takes place.

Dust and the like can be discharged from the gas flow outlet 70 by the flow of the protecting gas injected through the gas flow inlet 69 with baffle plates suitably arranged. However, the dust generated from the sliding portions between the press frame 55 and the top lid 53 is difficult to discharge by the flow of the protecting gas. Therefore, the shielding members 71A and 71B are provided to prevent the generated dust from falling on the substrates 41.

When oxidation of the substrate 41 within the containing chamber 50 presents a problem, an inert gas such as nitrogen as the protecting gas can be introduced from the gas flow inlet 69. Also in this case, the nitrogen gas is discharged from the gas flow outlet 70 through a pipe (not shown) into the open air so that such an accident such as the operator being over exposed is prevented.

Further, the housing 46 contains the pressure vessel 43, and in order to avoid emergency leakage of the gas from the pressure vessel 43, a lid member 72 opening and shutting by pivoting about a hinge 72A is provided at the top of the housing 46.

The lid member 72 is normally held shut by dead weight when the pressure within the housing 46 reaches the value exceeding the dead weight, the lid member 72 functions as a safety valve opening outward about the hinge 72A. The weight of the lid member 72 is predetermined such that gas leakage during a treatment under as a high pressure as 100 MPa or slightly above is prevented. When the size of the lid member 72 having the function of a safety valve is considered, it is preferred that the safety device be a lid member having one end thereof fixed, rather than be a valve.

Since the lid member functions as a safety valve, it is advantageous to have a vinyl sheet or similar material positioned about the lid member. By having edge portions of the vinyl sheet attached with, for instance, an adhesive agent to the frame at the top face of the housing, it serves as a safety valve. Even if a great amount of gas should leak out to blow off the valve member, the surrounding building and machinery could be at least partially protected against serious damage.

Figure 15:
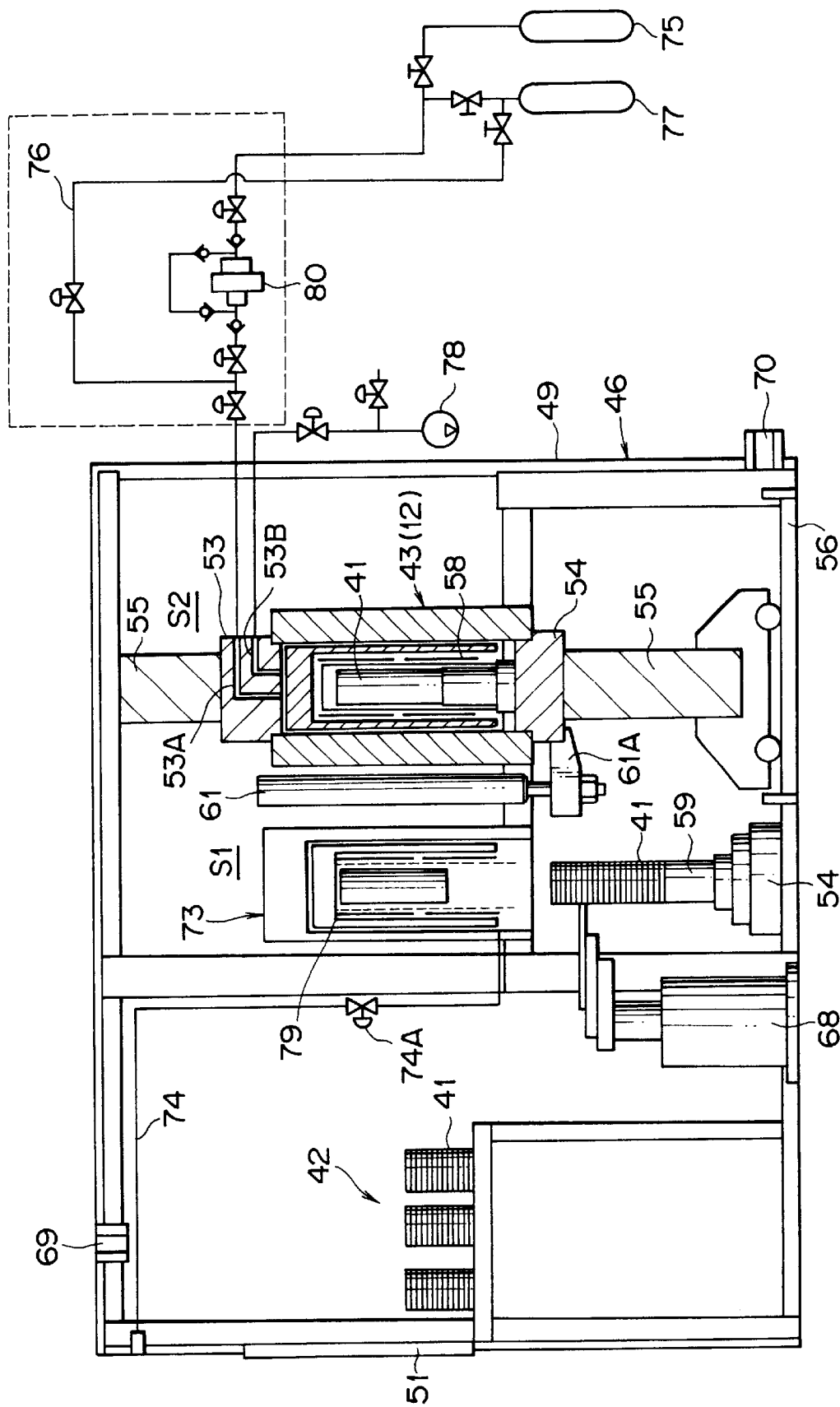
FIG. 15 is a front elevation showing an overall structure of a treatment apparatus in accordance with a sixth embodiment of the present invention in a state to insertion of substrates into a reducing furnace.
Figure 16:
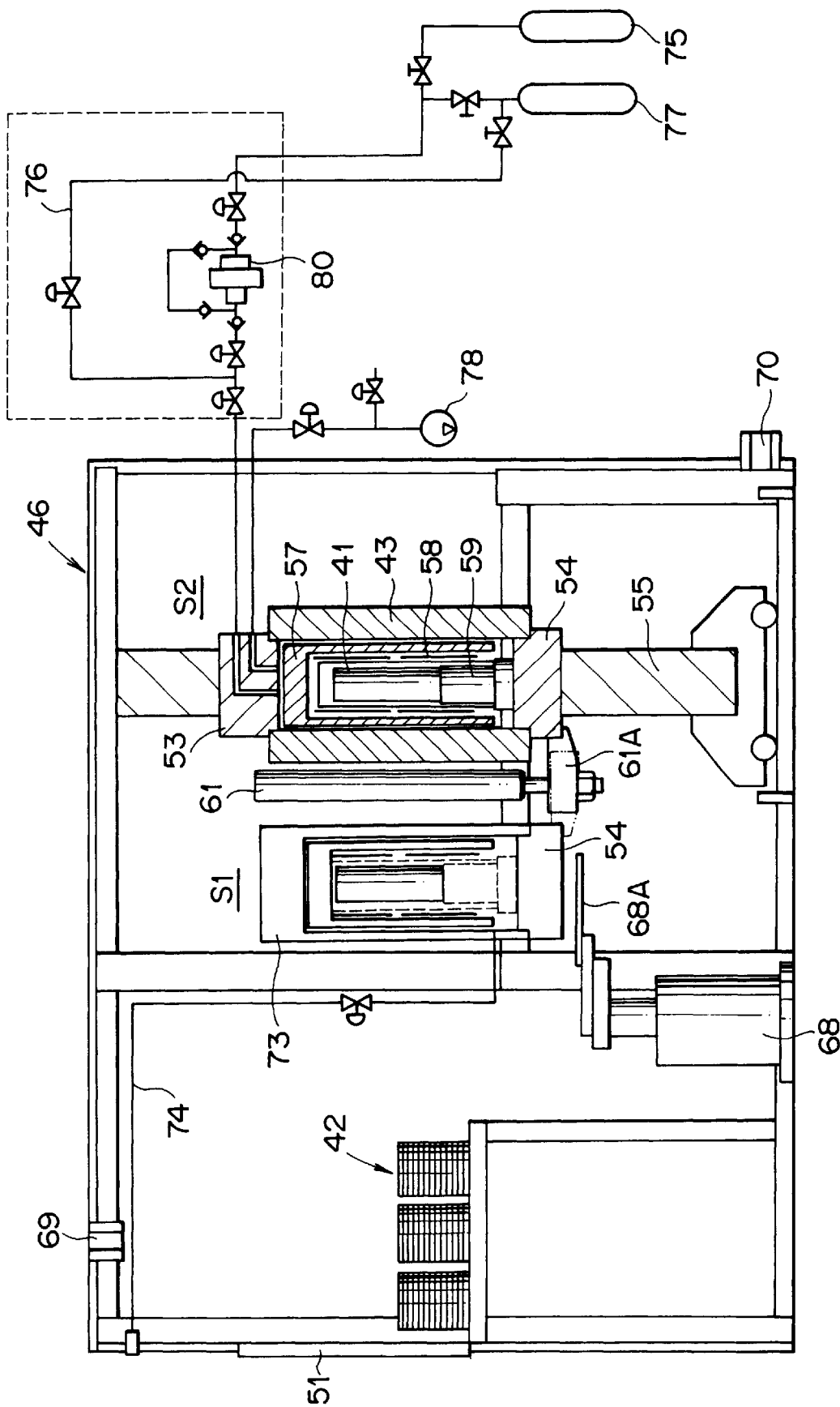
FIG. 16 is a front elevation similar to FIG. 15 showing substrates inserted into the reducing furnace depicted in FIG. 15.
Figure 17:
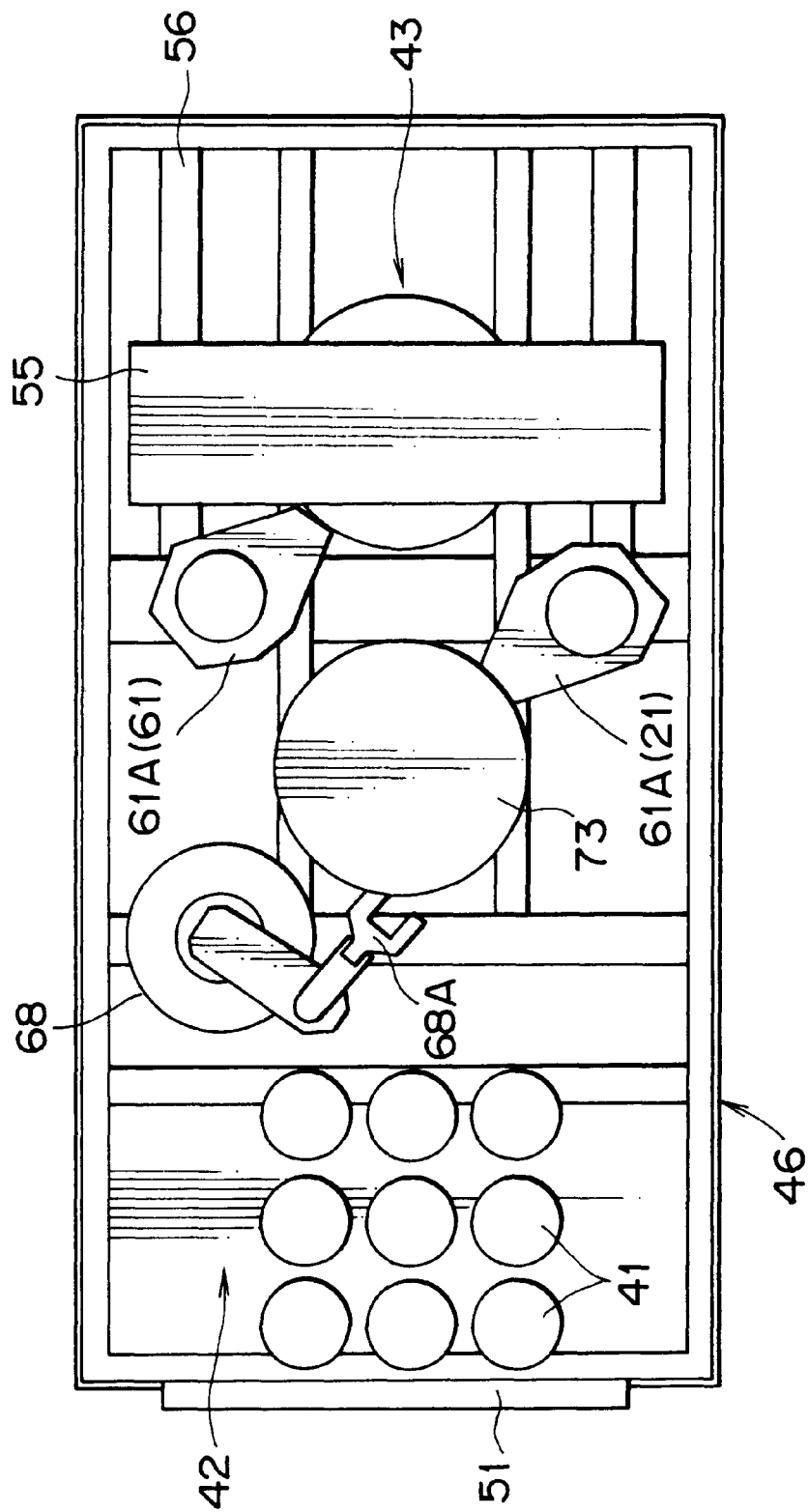
FIG. 17 is a top plan view of the treatment apparatus depicted in FIG. 15 and FIG. 16.

FIGS. 15, 16 and 17 show a sixth embodiment of the high-temperature and high-pressure treatment apparatus in accordance with the present invention. The apparatus includes a stocking portion 42, a reducing station S1 for reducing an oxidized film formed on the substrate 41 with a reducing gas before it is treated under pressure in the gas atmosphere, and a pressurizing station S2 for pressure treating the substrates 41 in the gas atmosphere in the treating chamber 44 within the pressure vessel 43. These components are housed in the airtight housing 46 in a manner similar to the embodiment described above.

The reducing station S1 is formed of a reducing furnace 73 incorporating a heater 79 of an electric resistance wire heating type. The furnace 73 is connected with a pipe member 74 for supplying the reducing gas such as hydrogen to the furnace 73 through opening and shutting operation of a valve 74A.

Such components as the pressure vessel 43, bottom lid lifting and turning apparatus 61, supporting jig 62 having the substrates 41 set therein in a shelved arrangement, and the shifting and mounting apparatus 68 are corresponding to those described with reference to FIGS. 11, 12, 13 and 14. Therefore, these corresponding components are denoted by reference numerals corresponding to the previously described elements and are generally the same as those elements.

Referring to FIGS. 15 and 16, the high-pressure gas inlet/outlet hole 53A formed in the top lid 53 is connected with a gas accumulating apparatus 75 via a compressor 80 that is, for example, a reciprocating type pressurizing apparatus, and with a gas recovery apparatus 77 via a bypass circuit 76, through various selectively operable valves, as shown in FIGS. 15 and 16, while the evacuation hole 53B is connected with a vacuum pump 78.

Further, the bottom lid (including the lower bottom lid) 54 of the pressure vessel 43 is disposed at a lower end of the reducing furnace 73 and serves as a bottom lid for both the pressure vessel 43 and serves as a bottom lid for the reducing furnace 73. The furnace pedestal 59 and the supporting jig 62 are mounted on the lid 554 and are insertable into and removeable from the reducing furnace 73 from below.

In the apparatus depicted in FIGS. 15, 16 and 17, there are two sets of the bottom lid lifting and turning apparatus 61. One bottom lid lifting and turning apparatus 61A is configured to support the substrates 41 in a stage prior to the pressure treatment, insertion into the reducing furnace 73 by means of the supporting jig 62 and subjected to the reducing process to remove the oxidized film with hydrogen. The other bottom lid lifting and turning apparatus 61 simultaneously may be used for moving and supporting the substrates 41 which have gone through the reducing process in the reducing furnace 73 with a corresponding supporting jig 62 and are to be subjected to the pressure treatment in the high-temperature and high-pressure atmosphere within the treatment chamber of the pressure vessel 43.

The shifting and turning apparatus 68 is configured to move the substrates 41 contained in the cassette on the stocking portion 42 into supporting jig 62 on the bottom lid 54 one by one so that they are arranged in a shelved manner. Therefor, the shifting and turning apparatus 68 is enabled to make turning operation in addition to lifting operation.

Namely, the apparatus shown in FIGS. 15, 16 and 17 include the supporting jig 62 configured to retain a plurality of the substrates 41 set in the shelved manner and is enabled, by means of the supporting jig 62, to take the plurality of substrates set in the shelved manner into and out of the reducing furnace 73 of the reducing station and the pressure vessel 43 of the pressurizing station by the use of the bottom lid lifting and turning apparatus 61.

As mentioned above, the bottom lid 54 of the pressure vessel 43 is also used as the bottom lid of the reducing furnace 73, and on the bottom lid 54 the supporting jig 62 retaining the plurality of substrates 41 in the shelved arrangement is disposed.

Thus, the plurality of the substrates are allowed to be moved into and out of the reducing furnace 73 and the pressure vessel 43 from below by means of the bottom lid lifting and turning apparatus 61.

Further, the casing 60 is provided surrounding, at least in the treating chamber 44, the supporting jig 62 and the plurality of the substrates 41 similar to the above described embodiment depicted in FIG. 13. Further, the airtight housing 46 is provided for housing the reducing station S1 and the pressurizing station S2. In the housing 46, the gas flow inlet 69 and the gas flow outlet 70 are provided for allowing flow of a protecting gas through the interior of the housing 46.

Further, there is provided the load port adjacent to the stocking portion 42 in the housing 46 with the door 51 therebetween.

The operations of the apparatus shown in FIGS. 15, 16 and 17 are briefly described below. Referring to FIG. 15, the Si wafers that have gone through the process for forming a film thereon, specifically, substrates 41, are contained in a resin cassette are located on the stocking portion 42 after having been placed there through the door 51 on the left side of FIG. 15. The stocking portion 42 is provided with a cassette shifting mechanism (not shown) for moving the cassette to a position where the wafer transporting robot 68 can engage the substrates 41. In other words, the cassette that is ready for treatment is placed in the position accessible by the robot. The robot 68 extracts substrates 41, one by one or groups of them at a time, from the resin-made cassette and then positions the substrates 41 in the supporting jig 62 that is located on the bottom lid 54 under the reducing station. With the substrates 41 positioned therein, the supporting jig 62 together with the bottom lid 54, is raised upward and inserted into the reducing furnace 73 by the bottom lid lifting and turning apparatus 61. The interior of the housing 46 is filled with an inert gas, and, thereafter hydrogen gas is introduced into the reducing furnace 73 in succession thereto and the temperature is raised to 350–400° C. At this time, prior to the reducing process, the reducing furnace 73 may be evacuated in order to decreasing contamination. After the reduction process has finished with the furnace kept heated for a predetermined period of time, the temperature is lowered to a point at which no further reaction and the like arises and, then, the bottom lid 54 is lowered. Thereupon, the bottom lid 54 with the wafer cassette mounted thereon is shifted under the pressure vessel 43 by turning operation. After the bottom lid 54 is inserted into the opening at the bottom of the pressure vessel 43 by the bottom lid lifting and turning apparatus 61, the press frame 55 is slid under the bottom lid 54 so as to support a central under portion of the pressure vessel 43. By starting the compressor, high-pressure argon gas is supplied from the argon gas accumulating apparatus. At the same time as or shortly thereafter, the heater 58 within the pressure vessel 43 is energized so that the temperature rises. By holding inside the vessel under the condition of predetermined temperature and pressure, voids remaining under the copper wiring film on the substrates 41 are pressure-crushed. When, after some time, the temperature has been lowered and, further, the pressure is brought as low as atmospheric pressure, the bottom lid 54 is opened and the Si wafers contained in the cassette are recovered.

What is claimed is:

1. A high-temperature and high-pressure treatment apparatus suitable for treating substrates in a high-temperature and high-pressure gas atmosphere, said apparatus comprising:

a pressure vessel;

a treating chamber defined within said pressure vessel;

a gas passage defined in a portion of said pressure vessel for introducing a high pressure gas into said pressure vessel;

a heater provided within said treating chamber of said pressure vessel; and a supporting jig configured for supporting a plurality of the substrates in a shelved arrangement within said treating chamber, said supporting jig being insertable and removable from said treating chamber together with the substrates, wherein said pressure vessel is provided with an opening for allowing the plurality of the substrates to be inserted and removed from said pressure vessel by movement of said supporting jig, said opening being covered by a cover made of an airtight material, and said cover being configured to allow a gas to selectively flow into or out of an inner side of said cover; and wherein said supporting jig has a cylindrical shape and is provided with at least one opening in a cylindrical wall portion thereof, and said supporting jig is further provided with at least one oxygen getter member that is disposed at one of a top portion and a bottom portion thereof.

2. The high-temperature and high-pressure treatment apparatus according to claim 1, further comprising a casing configured to surround said supporting jig with said supporting jig inserted in said treating chamber.

3. The high-temperature and high-pressure treatment apparatus according to claim 2, wherein said casing comprises an inner casing and an outer casing with a gas passage defined therebetween, an opening is formed in said inner casing at a top portion thereof, and at least one of said at least one oxygen getter member is disposed in the vicinity of said opening.

4. The high-temperature and high-pressure treatment apparatus according to claim 3, wherein said oxygen getter member is made from one of titanium and zirconium.

5. The high-temperature and high-pressure treatment apparatus according to claim 1, wherein said supporting jig is supported in said treating chamber on a treating stand positionable at a lower portion of said treating chamber and said treating stand is provided with a heat insulating material disposed therein.

6. The high-temperature and high-pressure treatment apparatus according to claim 5, wherein said treating stand and said supporting jig mounted thereon are insertable and removable into and out of said treating chamber by ascending and descending motion of a bottom lid of said pressure vessel, said treating stand being disposed on said bottom lid.

7. The high-temperature and high-pressure treatment apparatus according to claim 1, wherein said oxygen getter member is made from one of titanium and zirconium.

8. The high-temperature and high-pressure treatment apparatus according to claim 1, wherein said cover is configured to allow an inert gas to selectively flow into an inner side of said cover so as to define said gas passage.

9. The high-temperature and high-pressure treatment apparatus according to claim 1, further comprising:
an evacuating port formed in said cover,
a port valve connected to said evacuating port formed in said cover, said port valve being configured to selectively control gas communication through said port valve, wherein said cover is one of a top lid and a bottom lid of said pressure vessel.

10. The high-temperature and high-pressure treatment apparatus according to claim 1, further comprising:
a pipe system connected with said treating chamber for supplying a reducing gas into said treating chamber;
an inlet provided in said casing for allowing the reducing gas supplied from said pipe system to flow into said casing; and
a stop valve disposed in said pipe system.

11. The high-temperature and high-pressure treatment apparatus according to claim 1, further comprising:
a stocking portion for stocking the substrates within said apparatus;
a transport apparatus for moving the substrates from said stocking portion into and out of said treating chamber; and
an airtight housing surrounding said stocking portion, said transport apparatus, and said pressure vessel.

12. The high-temperature and high-pressure treatment apparatus according to claim 11, said apparatus further comprising:
a bottom lid disposed at a bottom end of said pressure vessel for covering an opening formed at the bottom end of said pressure vessel, a furnace pedestal and said supporting jig supported on said bottom lid, said furnace pedestal and said supporting jig being adapted to be taken into and out of said pressure vessel through said opening, and
wherein, said transport apparatus includes means for for moving and rotating said bottom lid between said stocking portion and said treating chamber.

13. The high-temperature and high-pressure treatment apparatus according to claim 11, wherein said airtight housing is provided with a gas inlet and a gas outlet for selectively allowing a protecting gas to flow in and out of said airtight housing.

14. The high-temperature and high-pressure treatment apparatus according to claim 11, further comprising a shielding member within said airtight housing for shielding portions of said airtight housing from said pressure vessel, said shielding member leaving said bottom lid of said pressure vessel exposed to said portions of said airtight housing.

15. The high-temperature and high-pressure treatment apparatus according to claim 11, wherein said airtight housing is provided with a lid member that defines a safety valve for relieving internal pressure of said airtight housing.

16. The high-temperature and high-pressure treatment apparatus according to claim 15, wherein
said pressure vessel includes a removable bottom lid at a bottom end opening of said pressure vessel, a furnace pedestal supported on said bottom lid, said supporting jig supported on said furnace pedestal,
said supporting jig, said furnace pedestal and said bottom lid are integrally adapted to be moved into and out of said pressure vessel from an underside thereof,
said transport means includes:
a bottom lid lifting and turning apparatus for moving and turning said bottom lid, and
a shifting and mounting apparatus disposed between said bottom lid lifting and turning apparatus and said stocking portion for moving the substrates on said stocking portion to said bottom lid lifting and turning apparatus, and wherein
a bottom lid of said reducing furnace and said bottom lid of said pressure vessel are interchangeable such that said furnace pedestal and said supporting jig disposed on said bottom lid of said pressure vessel are integrally adapted to be moved into and out of said reducing furnace from an underside thereof.

17. The high-temperature and high-pressure treatment apparatus according to claim 11, further comprising a reducing furnace disposed in said airtight housing proximate said pressure vessel for reducing oxidized film formed on a surface of the substrates.

18. A method of making a high-temperature and high-pressure treatment apparatus, the method comprising
placing at least one oxygen getter member within a treating chamber within a pressure vessel; and
producing the apparatus of claim 1.

* * * * *